United States Patent
Nakayama et al.

(10) Patent No.: US 8,373,113 B2
(45) Date of Patent: Feb. 12, 2013

(54) CALIBRATION STANDARD MEMBER, METHOD FOR MANUFACTURING THE MEMBER AND SCANNING ELECTRONIC MICROSCOPE USING THE MEMBER

(75) Inventors: Yoshinori Nakayama, Sayama (JP); Takashi Tase, Tokorozawa (JP); Jiro Yamamoto, Tachikawa (JP)

(73) Assignee: Hitachi High-Technologies Corporation, Tokyo (JP)

( * ) Notice: Subject to any disclaimer, the term of this patent is extended or adjusted under 35 U.S.C. 154(b) by 96 days.

(21) Appl. No.: 13/127,912

(22) PCT Filed: Oct. 22, 2009

(86) PCT No.: PCT/JP2009/005562
§ 371 (c)(1),
(2), (4) Date: May 5, 2011

(87) PCT Pub. No.: WO2010/052840
PCT Pub. Date: May 14, 2010

(65) Prior Publication Data
US 2011/0210250 A1  Sep. 1, 2011

(30) Foreign Application Priority Data
Nov. 5, 2008 (JP) .................................. 2008-284549

(51) Int. Cl.
*H01J 37/28* (2006.01)
(52) U.S. Cl. .................................... 250/252.1; 250/310
(58) Field of Classification Search ............... 250/252.1, 250/310
See application file for complete search history.

(56) References Cited

U.S. PATENT DOCUMENTS
4,139,933 A  *  2/1979  Ballard et al. .................. 29/412
(Continued)

FOREIGN PATENT DOCUMENTS
JP   64-032107     2/1989
JP   4-289411 A    10/1992
(Continued)

OTHER PUBLICATIONS

Ichiko Misumi et al. "Nanometric lateral scale development with $Si/SiO_2$ multilayer thin-film structures and improvement of uncertainty evaluation using analysis of variance", Measurement Science and Technology, Apr. 2008, vol. 19, No. 4 045101 (10pp).

(Continued)

*Primary Examiner* — Kiet T Nguyen
(74) *Attorney, Agent, or Firm* — Miles and Stockbridge P.C.

(57) ABSTRACT

This invention provides a standard member allowing magnification calibration for use in an electron microscope to be performed with high precision. A (110) or (100) oriented silicon substrate including a magnification calibration pattern comprised of a constant pitch periodic pattern and a (110) or (100) oriented silicon substrate not including the constant pitch periodic pattern are bonded together by means of bonding without using an adhesive agent, while aligning the plane directions of the surfaces of the two substrates in the same orientation. Then, the thus bonded substrates are cleaved or diced so that their (111) surfaces or (110) surfaces become cross-section surfaces. Further, by selectively etching one side of the constant pitch periodic pattern, a standard member with no level difference and no damage to superlattice patterns and having a constant pitch concavity and convexity periodic pattern in a cross-section surface vertical to the substrate surface is created.

20 Claims, 19 Drawing Sheets

U.S. PATENT DOCUMENTS

| | | | |
|---|---|---|---|
| 8,263,929 B2 * | 9/2012 | Nakayama et al. | ........ 250/252.1 |
| 2008/0203285 A1 | 8/2008 | Sohda et al. | |
| 2008/0251868 A1 | 10/2008 | Nakayama et al. | |

FOREIGN PATENT DOCUMENTS

| | | |
|---|---|---|
| JP | 07-218201 A | 8/1995 |
| JP | 08-094346 A | 4/1996 |
| JP | 3104899 B2 | 9/2000 |
| JP | 2008-215824 A | 9/2008 |
| JP | 2008-261689 A | 10/2008 |

OTHER PUBLICATIONS

Ichiko Misumi et al., "Application of a GaAs/InGaP superlattice in nanometric lateral scales", Measurement Science and Technology, Sep. 2007, vol. 18, No. 9, p. 2743-2749.

Misumi et al., "Design and Fabrication of Nanometric Lateral Scale Consisting of GaAs/InGaP Superlattice", 2006 Prc. IMEKO XVIII World Congress, Metrology for a Sustainable Development (Rio de Janeiro, Sep. 17-22, 2006).

* cited by examiner

40 SILICON LAYERS AND 40 SILICON OXIDE FILM LAYERS

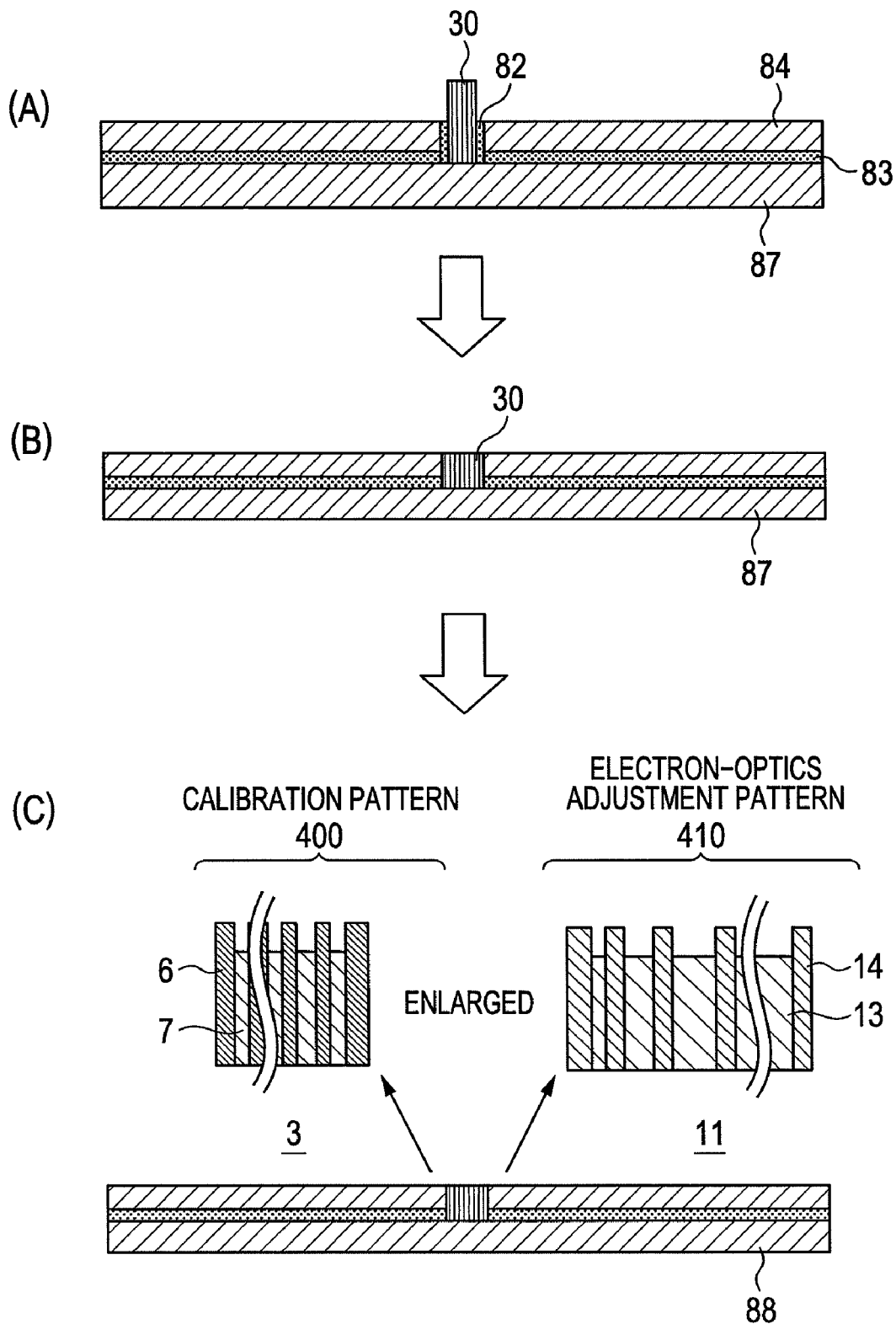

CALIBRATION STANDARD MEMBER, METHOD FOR MANUFACTURING THE MEMBER AND SCANNING ELECTRONIC MICROSCOPE USING THE MEMBER

TECHNICAL FIELD

The present invention relates to a standard sample that is used to calibrate a scanning electronic microscope and a method for fabricating the standard sample as well as a scanning electronic microscope using the same.

BACKGROUND ART

Recently, semiconductor devices are becoming more and more miniaturized and dimensional control with a higher degree of precision is required. Consequently, dimensional control by means of length measurement apparatus using an electron beam, based on a scanning electronic microscope, is implemented on semiconductor manufacturing site. Measuring precision of this dimensional control depends on the precision of magnification calibration of the scanning electronic microscope.

Measurement is performed at high magnification to handle miniaturized semiconductor devices, which results in that the field of view of the scanning electronic microscope becomes a narrow region. Therefore, the miniaturization of a standard sample for magnification calibration is required to a degree equivalent to or finer than the miniaturization degree of a semiconductor pattern. In an attempt to satisfy this, superlattice samples as made public in Patent Document 1 and Non-patent Document 1 are proposed as calibration samples miniaturized to a degree of a pitch linewidth of 100 nm or less.

RELATED ART DOCUMENTS

Patent Document

Patent Document 1: Japanese Patent No. 3104899 B2

Non-Patent Document

Non-patent Document 1: I. Misumi, S. Gonda, O. Sato, K. Sugawar, Q. Huang, T. Kurosawa, and T. Takatsuji, "Design and Fabrication of Nanometric Lateral Scale Consisting of GaAs/InGap Superlattice.", 2006 Prc. IMECOX-VIII World Congress, Metrology for a Sustainable Development (Rio de Janeiro, 17-22 September).

SUMMARY OF THE INVENTION

Problems to be Solved by the Invention

However, using the above-mentioned calibration samples of related art to calibrate the magnification of a scanning electronic microscope involves the following problems.

In a case where a cross-section sample is used as a calibration sample, when a substrate surface layer in which a superlattice pattern resides is cut to make cross-section surfaces, substrate end faces are exposed, resulting in a level difference. For a scanning electronic microscope for use in semiconductor inspection, because a voltage is applied to a specimen side to control a voltage accelerating an electron beam, if the above level difference exists, local surface electric field distribution takes place in the level difference part, which results in an astigmatic difference. For the superlattice samples as suggested in Patent Document 1 and Non-patent Document 1, a method of bonding identical cross-section samples together using an adhesive agent is contemplated.

A first problem encountered by samples bonded in this way is as follows. When two substrates are bonded together by an adhesive agent, the superlattice patterns of both substrates are disposed facing each other and fixed by filling a gap of about several microns between them with an adhesive agent. As the bonded substrates are abraded, a part of the adhesive agent is exfoliated during abrasion and causes damage to a superlattice part positioned nearby, and a part of a superlattice pattern is harmed. Or the exfoliated part of the adhesive agent remains on the superlattice pattern and becomes a foreign material.

As a second problem, when magnification calibration of a scanning electronic microscope is performed on the basis of a pitch linewidth of a pattern on a cross-section surface, if the calibration pattern is not positioned vertically to the scanning by the electron beam, a calibration error occurs in proportion to inclination. Therefore, for abrasion of the cross-section surface, a precision for making the cross-section surface vertical to the substrate is required. However, precision setup of mechanical abrasion is limited. In terms of an absolute value for a linewidth of 100 nm, an inclination of one degree causes an error of 0.02 nm only in respect of this angular precision. This poses a problem, as a tolerable calibration error within about 0.02 is required in future dimensional control.

Thirdly, for a magnification calibration pattern, it is necessary that its pitch linewidth is obtained with high precision beforehand by any measurement means. For uniform pitch periodic patterns, it is possible to measure their pitch linewidths with high precision by means of a diffraction angle measurement using light or x-ray. In the diffraction angle measurement using light or x-ray, a region of 1 mm square or more on a calibration sample is irradiate by light or x-ray and an average pitch linewidth within the irradiation region is obtained.

However, since the superlattice samples as suggested in Patent Document 1 and Non-patent Document 1 have a structure in which cross-section samples with uniform pitch linewidths are bonded together in a back to back form, if the diffraction angle measurement using light or x-ray is performed, the two cross-section samples bonded together in a back to back form are irradiated by light or x-ray. In this measurement, if the two cross-section samples have an identical pitch between layers, unless a distance between the cross-section samples is exactly an integral multiple of the pitch between layers, diffracted rays from both interfere with each other. Due to this, the diffraction intensity attenuates and measurement with high precision cannot be performed. If the pitch linewidths of the two cross-section samples differ slightly, diffracted rays from both overlap and an average pitch linewidth of the pitch linewidths of the two cross-section samples is obtained. Since samples are measured at a high magnification when magnification calibration of a scanning electronic microscope is performed, there is a problem in which calibration on the bases of a pitch linewidth between layers of either one of the two cross-section samples gives rise to an error.

A main object of the present invention is to provide a standard member and a method for fabricating the standard member as well as a scanning electronic microscope using same, making it possible to carry out magnification calibration for use in an electron microscope with high precision.

Means of Solving the Problems

One example of a typical aspect of the present invention is set forth below. A standard member for calibration of the present invention is a standard member for calibration calibrating a scanning electronic microscope, comprising a bonded substrate into which a first sample cube and a second sample cube, each comprising a multi-layer film structure in which different materials are alternately deposited in layers over the surface of a substrate and its cross-section surfaces, are bonded together, their plane directions being aligned in the same orientation at the surfaces of both the multi-layer film structures; and a calibration pattern area defined on one of the cross-section surfaces of the bonded substrate, wherein a pair of concavity and convexity patterns are formed in the calibration pattern area by fabricating each multi-layer film structure, and wherein the cross-section surfaces are (111) surfaces when the surfaces of both the substrates are (110) surfaces, and the cross-section surfaces are (110) surfaces when the surfaces of both the substrates are (100) surfaces.

Effects of the Invention

According to the present invention, it is possible to dispose the magnification calibration pattern on a vertical cross-section surface and a flat plane on an atomic level, which avoids the occurrence of local surface electric field distribution in a level difference part, and an accurate magnification calibration can be carried out. As such, it is possible to provide a standard member for calibration allowing magnification calibration for use in an electron microscope to be performed with high precision and a method for fabricating the standard member as well as a scanning electronic microscope using same.

BRIEF DESCRIPTION OF THE DRAWINGS

FIG. 17 is a diagram depicting a part of the process in the fourth embodiment.

MODE FOR CARRYING OUT THE INVENTION

Figure 1A:
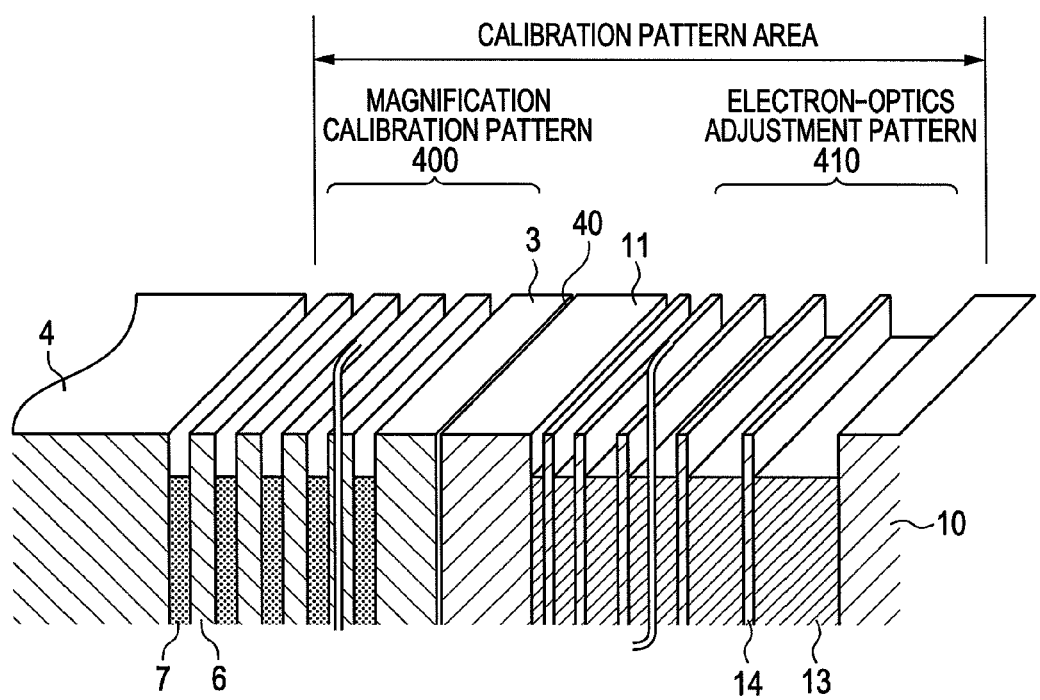
FIG. 1A is a schematic view of a standard member illustrative of a first embodiment of the present invention, which is also an enlarged view of a calibration pattern area in FIG. 1B.

According to an exemplary embodiment of the present invention, a (110) or (100) oriented silicon substrate including a magnification calibration pattern which is comprised of a constant pitch periodic pattern and a (110) or (100) oriented silicon substrate not including the constant pitch periodic pattern are bonded together by means of bonding without using an adhesive agent, while aligning the plane directions of the surfaces of the two substrates in the same orientation. Then, the thus bonded substrates are cleaved so that their (111) surfaces or (110) surfaces become cross-section surfaces. Further, by selectively etching one side of the constant pitch periodic pattern, it is possible to create a standard member with no level difference and no damage to superlattice patterns and having a constant pitch concavity and convexity periodic pattern in a cross-section surface vertical to the substrate surface.

A concavity and convexity pitch in the multi-layer part of this standard member is previously obtained by light or x-ray diffraction and loaded into the electron microscope. By comparing a result of measuring the concavity and convexity pitch with the pitch in the multi-layer part obtained by the light or x-ray diffraction, magnification calibration of the scanning electronic microscope is performed.

Examples of characteristic components included in the present invention are enumerated below.

(1) A standard member for calibration of the present invention is a standard member for calibration calibrating a scanning electronic microscope that, from information for intensity of secondary or reflected electrons generated by scanning an observation region of an object to be inspected by an incident electron beam, performs measurement of a pattern within the observation region, wherein, in abutment with an end face of a substrate having a constant pitch concavity and convexity periodic pattern, by disposing a substrate not having the constant pitch concavity and convexity periodic pattern adjoined the end face without a gap, it is possible to perform magnification calibration using the constant pitch concavity and convexity periodic pattern without producing local surface electric field distribution in a level difference part, as flatness is provided.

(2) The standard member for calibration configured as above is characterized by including a concavity and convexity periodic pattern region in a vertical cross-section surface of a multi-layer substrate produced by multi-layer film material selective etching of a substrate cross-section surface having a multi-layer film structure.

(3) The standard member for calibration configured as above is characterized in that a pitch linewidth of a concavity and convexity pattern of a substrate having a multi-layer film structure is obtained by light or x-ray diffraction and a second substrate cross-section surface has a pattern structure that has no influence on the measuring precision of the light or x-ray diffraction, that is, having a structure not including a pattern in which a pitch linewidth is equal to or an integral multiple of the pitch linewidth of the constant pitch concavity and convexity periodic pattern of a first substrate.

(4) An invented method for fabricating a standard member for calibration is characterized by including a step of bonding two substrates without using an adhesive agent in order to dispose, in abutment with an end face of a substrate having a constant pitch concavity and convexity periodic pattern, a substrate not having the constant pitch concavity and convexity periodic pattern without a gap. The bonding step is characterized by including any of the following bonding steps: a step of bonding both silicon surfaces or oxide film surfaces of the substrates directly by heating these surfaces at about 1000° C.; an anodic bonding step of bonding the oxide film surface of either one substrate and the silicon surface of either other substrate by applying a voltage of several hundred volts (V) and heating; and a step of bonding at normal temperature, which bonds both silicon surfaces or oxide film surfaces of the substrates after activating the surfaces by an ion beam irradiation in a vacuum.

(5) In the method for fabricating a standard member for calibration, the bonding step is characterized by including a step of aligning the plane directions of the surfaces of two substrates in the same horizontal orientation by using a notch or orientation flat as a benchmark before the bonding is performed and then performing the bonding, wherein the two substrates are either (110) or (100) oriented silicon substrates, in order to provide a vertical cross-section surface having a concavity and convexity periodic pattern of a multi-layer substrate. The method is characterized by further including a step of cutting off a single substrate having the same orientation into which the substrates are bonded together by the bonding step so that (111) or (110) surfaces of the bonded substrate become cross-section surfaces.

If the two substrates are (110) oriented silicon substrates, after cleaving the bonded substrate, the cleaved surfaces become (111) surfaces and can make vertical cross-section surfaces of the (110) silicon substrates. If the two substrates are (100) oriented silicon substrates, after cleaving the bonded substrate, the cleaved surfaces become (110) surfaces and can make vertical cross-section surfaces of the (100) silicon substrate.

(6) The method for fabricating a standard member for calibration is characterized by including a step of obtaining beforehand a pitch linewidth of the standard member by light or x-ray diffraction, the standard member having no level difference and no damage to superlattice patterns and having a constant pitch concavity and convexity periodic pattern in a cross-section surface vertical to the substrate surface, created by selectively etching one side of the constant pitch periodic pattern. This pitch linewidth is compared with a result of measurement performed by the scanning electronic microscope and magnification calibration of the scanning electronic microscope is performed so that the difference between both becomes virtually zero.

In the following, embodiments of the present invention are described in detail with reference to the drawings.

First Embodiment

Figure 1B:
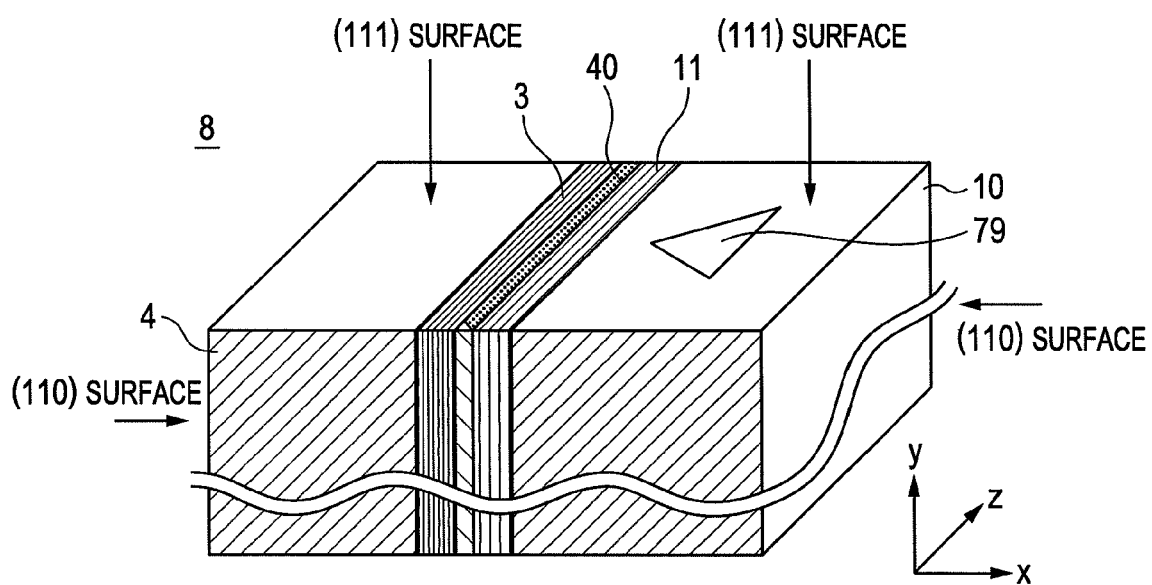
FIG. 1B is a perspective view showing the entire standard member illustrative of the first embodiment of the invention.
Figure 2:
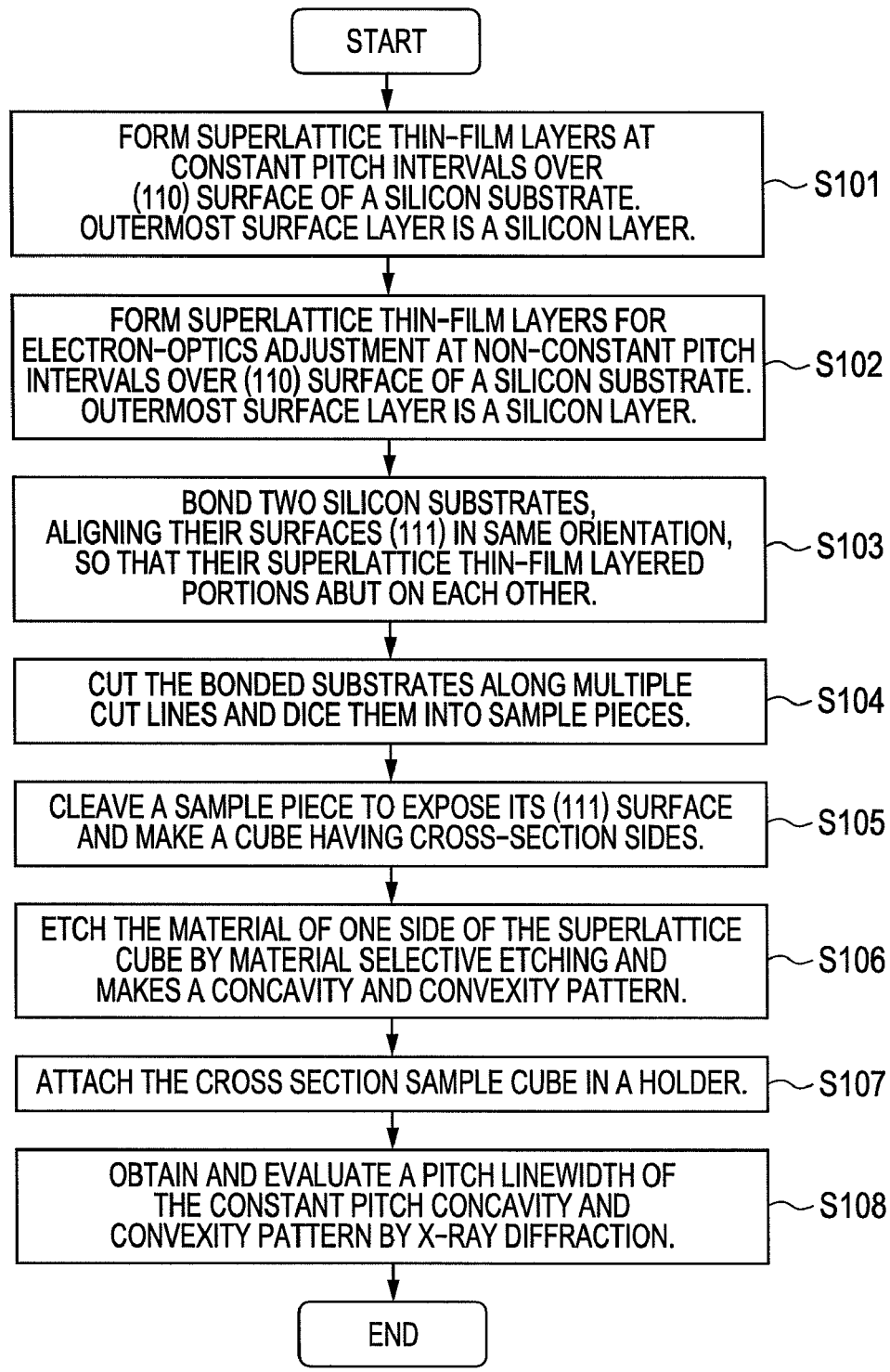
FIG. 2 is a diagram of a process flow for fabricating the standard member in the first embodiment.

A first embodiment of the present invention is described, using FIGS. 1 through 10. FIG. 1 are schematic views of a standard member illustrative of the first embodiment of the present invention. FIG. 2 illustrates an invented method for fabricating a standard member and FIGS. 3 through 10 depict schematic views relating to this method.

First, FIG. 1 (FIG. 1A, FIG. 1B) are schematic views of the standard member for calibration of the first embodiment of the present invention, wherein FIG. 1B is a perspective view showing the entire calibration pattern and FIG. 1A is an enlarged view of a calibration pattern area in FIG. 1B.

The standard member for calibration 8 is such that a magnification calibration pattern 400 comprising a multi-layer structure part 3 which is comprised of a multi-layer concavity and convexity periodic pattern produced by multi-layer film material selective etching of a substrate cross-section surface having a multi-layer film structure, an electron optics adjustment pattern 410 comprising a multi-layer structure part 11 for making a high-definition electron beam, and a bonding part 40 which connects these two pattern regions are formed within one "calibration pattern area". The multi-layer structure part 3 constituting the magnification calibration pattern 400 has a multi-layer film structure in which different materials are deposited in layers at constant pitch intervals over the surface of a substrate. For example, this multi-layer structure is comprised of silicon oxide film layers 6 and silicon layers 7. On the other hand, the multi-layer structure part 11 constituting the electron optics adjustment pattern 410 has a multi-layer film structure in which different materials are deposited alternately in layers at an uneven pitch over the surface of a substrate. For example, this multi-layer structure is comprised of silicon layers 13 whose thickness increases in a stepwise manner and silicon oxide film layers 14 having an even thickness. On the top surface of a silicon substrate 10, there is a pattern position identification mark pattern 79.

In this way, the standard member for calibration 8 is provided with a bonded substrate into which a first sample cube and a second sample cube respectively having the multi-layer film structures 3, 11 in which different materials are deposited alternately over the surface of a substrate are bonded together in the bonding part 40 with the mutual plane directions of the surfaces of both multi-layer film structures aligned in the same orientation, includes one calibration pattern area covering a cross-section surfaces of the first sample cube and cross-section surfaces of the second sample cube of the bonded substrate, and the calibration patter area includes a pair of concavity and convexity patterns (400, 410) formed by each of the multi-layer film structures.

The cross-section surfaces of the two elements bonded together are made by cleaving or dicing. When the surface of each substrate is a (110) surface, the cross section surfaces are (111) surfaces; when the surface of each substrate is a (100) surface, the cross section surfaces are (110) surfaces.

The surfaces of the two silicon substrates 4, 10 may be (111) surfaces or (100) surfaces. If they are (110) surfaces, the cross-section surfaces having the concavity and convexity patterns for calibrating the magnification calibration pattern 400 and the electron optics adjustment pattern 410 are (111) surfaces; if they are (100) surfaces, the cross-section surfaces are (110) surfaces.

In the present invention, the bonding means a bonding method in which, in a state that atoms are arranged in the surface layers of two opposing substrates 4, 10, discontinuous boundaries between the atom arrangement in the outermost surface layer of each substrate and air exist, sandwiching the air, before the bonding and these boundaries disappear after the bonding, and the atom arrangements in the outermost surface layers of the two opposing substrates turn into a continuous atom arrangement state.

Thus, in the standard member for calibration 8, the bonding part 40 connecting the two pattern regions has a mirror surface, like a single substrate. In the bonding part, the surfaces of the two substrates continue and there is no interface in the bonding plane; in other words, the bonding plane cannot be identified in the bonding part 40.

This standard member for calibration 8 is used to calibrate a scanning electronic microscope that, from information for intensity of secondary or reflected electrons generated by scanning an observation region of an object to be inspected by an incident electron beam, performs measurement of a pattern within the observation region. The magnification calibration pattern 400 and the electron optics adjustment pattern 410 provide a pattern structure that has no influence on the measuring precision of the light or x-ray diffraction, that is, a structure not including a pattern in which a pitch linewidth is equal to or an integral multiple of the pitch linewidth of the concavity and convexity pattern for magnification calibration. The pattern for electron optics adjustment is disposed adjacently in series on one axis in a longitudinal direction (x direction) of the standard member for calibration 8 and at substantially the same level as the other pattern and the widths (z direction) of both patterns are substantially equal. The magnification calibration pattern 400 and the electron optics adjustment pattern 410 are same in height (y direction) of their substrate surface. That is, the height of the substrate surface of the magnification calibration pattern 400 with respect to incident electrons is substantially the same as the height of the substrate surface of the electron optics adjustment pattern 410 with respect to incident electrons.

Then, a method for fabricating the standard member for calibration 8 of the present invention is described. First, this method is outlined. The standard member for calibration 8 is fabricated by the method including a step of forming a first substrate having a multi-layer film structure by depositing different materials in layers at constant pitch intervals over the surface of a substrate whose surface is formed of a (110) surface or a (100) surface, a step of forming a second substrate having a multi-layer film structure not including multiple layers formed at the same pitch intervals as the multi-layer film structure of the first substrate over a substrate whose surface is formed of a (110) surface or a (100) surface, a bonding step of bonding the surfaces of the multi-layer film structures of the first and second substrates and forming a bonded substrate, a step of forming a sample cube in which cross section sides of the bonded substrate are exposed, and a step of forming a bonded cross-section sample provided with a concavity and convexity pattern having a constant pitch linewidth by selectively etching only one material of the multi-layer film structure in which multiple layers are formed at intervals in one side of the cross-section surfaces. In the step of forming the sample cube, when the surface of each of the substrates is the (110) surface, the cross-section surfaces are (111) surfaces; when the surface of each of the substrates is the (100) surface, the cross-section surfaces are (110) surfaces.

Figure 3A:
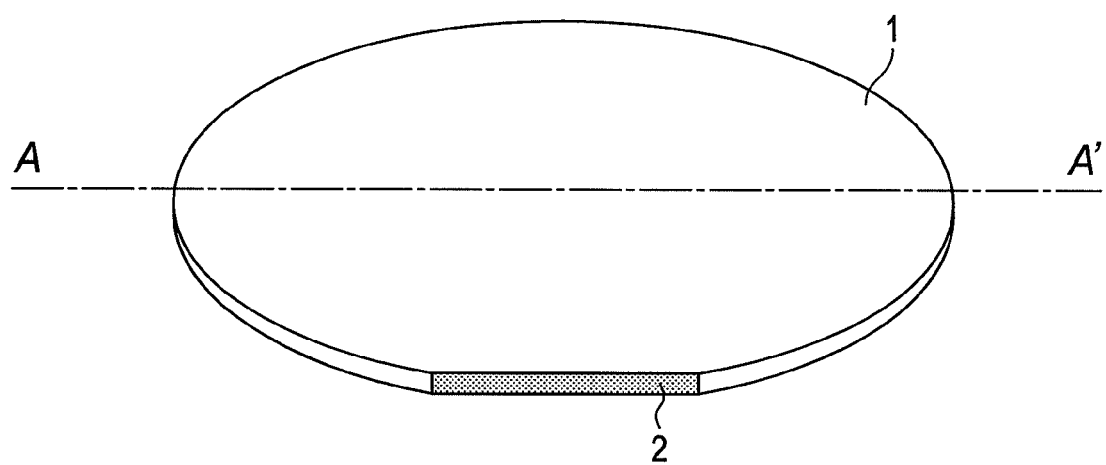
FIG. 3A is a perspective view of a substrate 1 as a wafer for a magnification calibration pattern in the first embodiment.
Figure 3B:
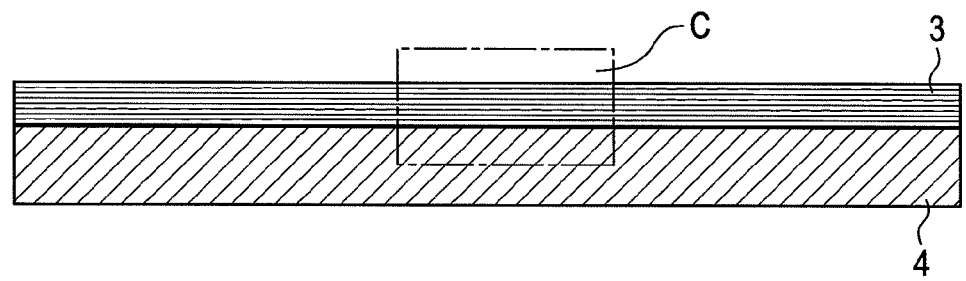
FIG. 3B is a cross-sectional view along A-A' line in FIG. 3A.
Figure 3C:
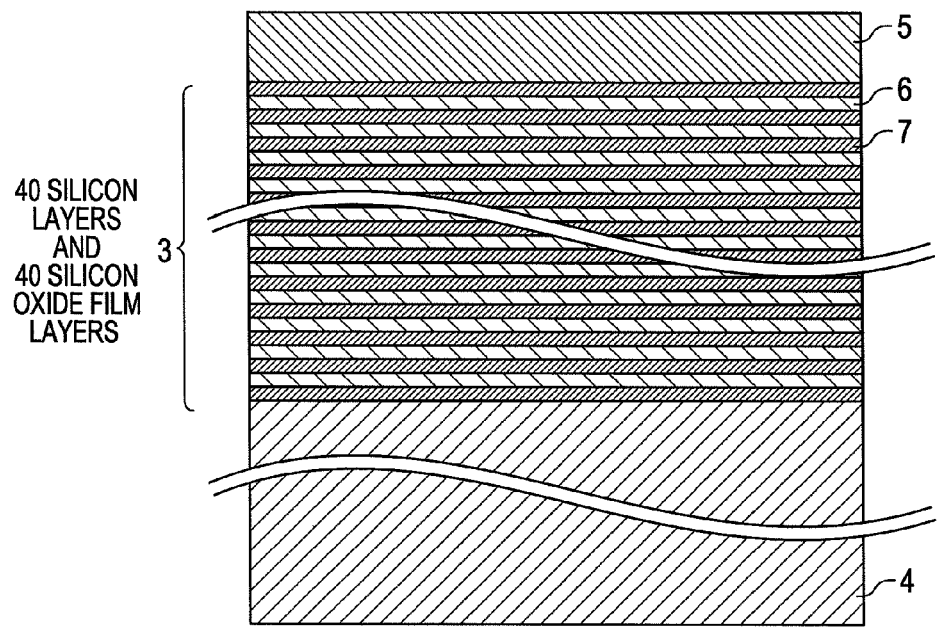
FIG. 3C is an enlarged view of a rectangular section C in FIG. 3B.

Details about the method for fabricating the standard member for calibration 8 is described based on a process flow shown in FIG. 2 and related structural diagrams. First, a substrate 1 for magnification calibration pattern 400 is formed (step S101). FIG. 3 (FIGS. 3A to 3C) depict a process of producing the substrate for magnification calibration pattern 400 from a wafer. FIG. 3A is a perspective view of the substrate 1, FIG. 3B is a cross-sectional view along A-A' line in FIG. 3A, and FIG. 3C is an enlarged view of a rectangular section C in FIG. 3B.

The substrate 1 is formed as follows: a multi-layer structure of silicon layers 7 and silicon oxide film layers 6, which becomes a magnification calibration part, is formed over the surface of a (110) oriented silicon substrate 4. 40 layers of each material are deposited by sputtering deposition, each layer having a thickness of 10 nm. That is, the substrate for magnification calibration pattern 400 has a multi-layer structure in which a plurality of silicon layers 6 having the same thickness and plural silicon oxide film layers 7 having the same thickness are alternately deposited over the surface of an 8-inch, (110) oriented silicon substrate 10 which is 725 μm thick. For example, the multi-layer structure 3 of silicon layers 6 and silicon oxide film layers 7 is formed over the substrate of the (110) oriented silicon substrate 4 by alternately depositing 40 layers of each material by sputtering deposition. Finally, a silicon layer 5 with a thickness of 100 nm is formed by sputtering deposition as a top layer, as shown in the enlarged view of FIG. 3C.

Figure 4A:
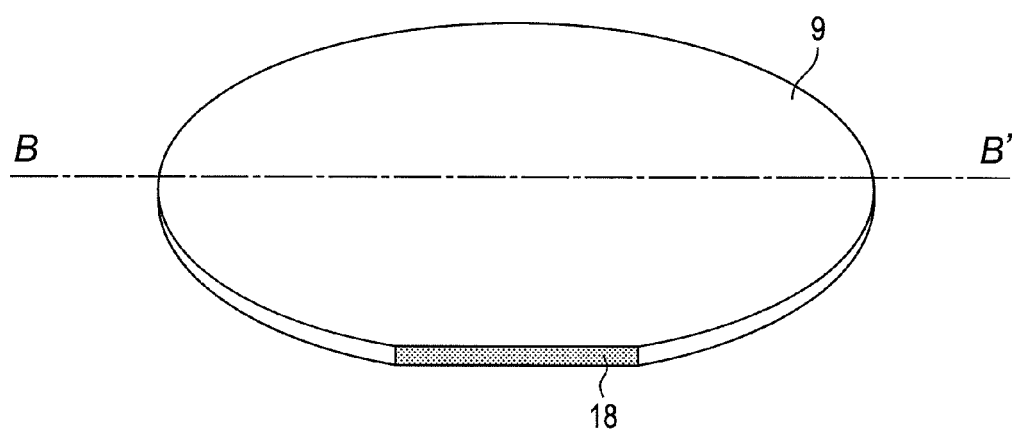
FIG. 4A is a perspective view of a substrate 9 as a wafer for an electron optics adjustment pattern in the first embodiment.
Figure 4B:
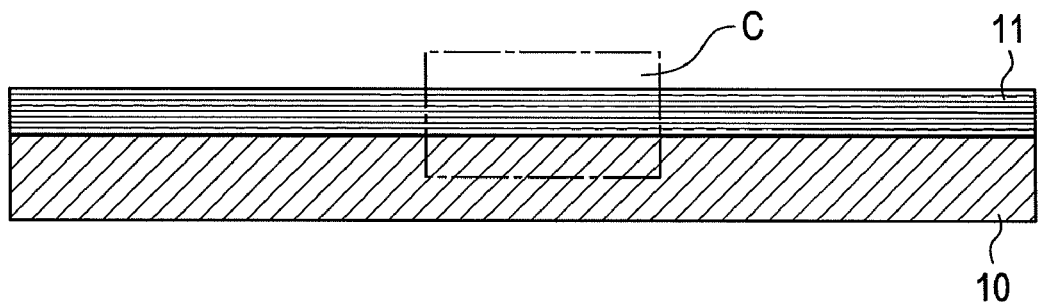
FIG. 4B is a cross-sectional view along A-A' line in FIG. 4A.
Figure 4C:
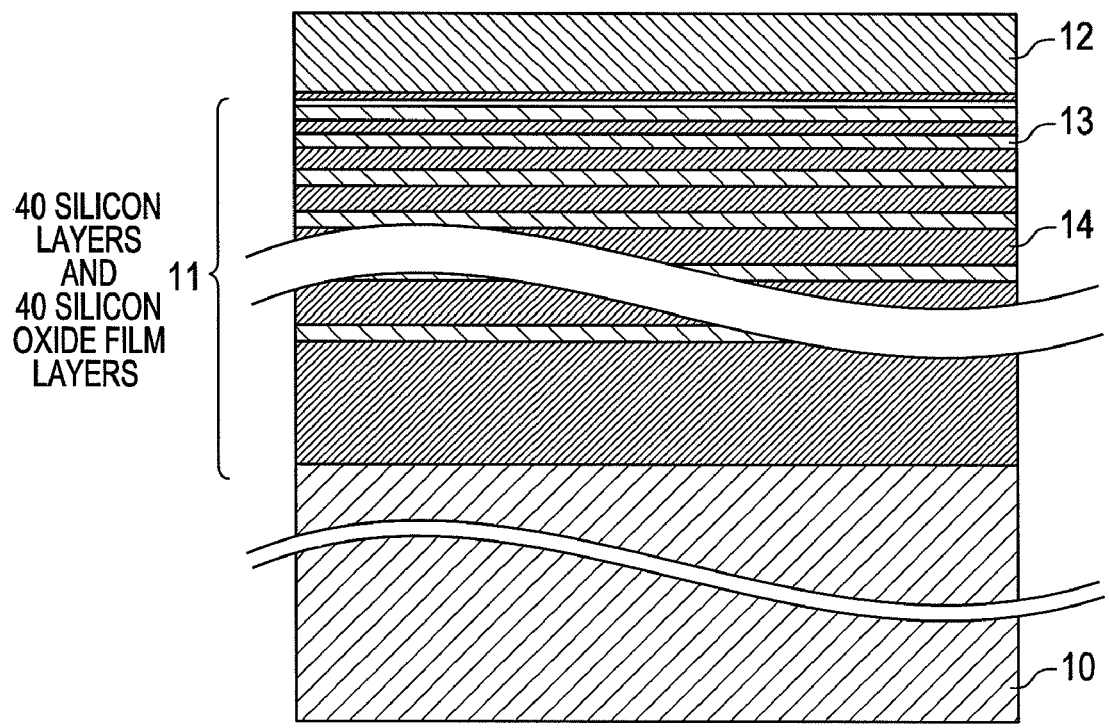
FIG. 4C is an enlarged view of a rectangular section C in FIG. 4B.

Then, a substrate 9 for electron optics adjustment pattern 410 is formed (step S102). FIG. 4 (FIGS. 4A to 4C) depict a process of producing the substrate for electron optics adjustment pattern from a wafer. FIG. 4A is a perspective view of the substrate 9, FIG. 4B is a cross-sectional view along B-B' line in FIG. 4A, and FIG. 4C is an enlarged view of a rectangular section C in FIG. 4B. The multi-layer structure part 11 constituting the electron optics adjustment pattern 410 is formed over the surface of the silicon substrate 10 by alternately depositing plural silicon layers 13 whose thickness increases in a stepwise manner and plural silicon oxide layers 14 having an even thickness. That is, over the surface of an 8-inch, (110) oriented silicon substrate 10 which is 725 μm thick similarly, an uneven pitch pattern, i.e., as the multi-layer structure 11 of silicon layers 13 and silicon oxide film layers 14, is formed by alternately depositing 20 silicon oxide layers 14 whose thickness is increased in 2 nm steps from 2 nm up to a thickness of 40 nm and silicon layers 13 with a constant thickness of 5 nm by sputtering deposition. Finally, a silicon layer 12 with a thickness of 100 nm is formed by sputtering deposition as a top layer.

Figure 5:
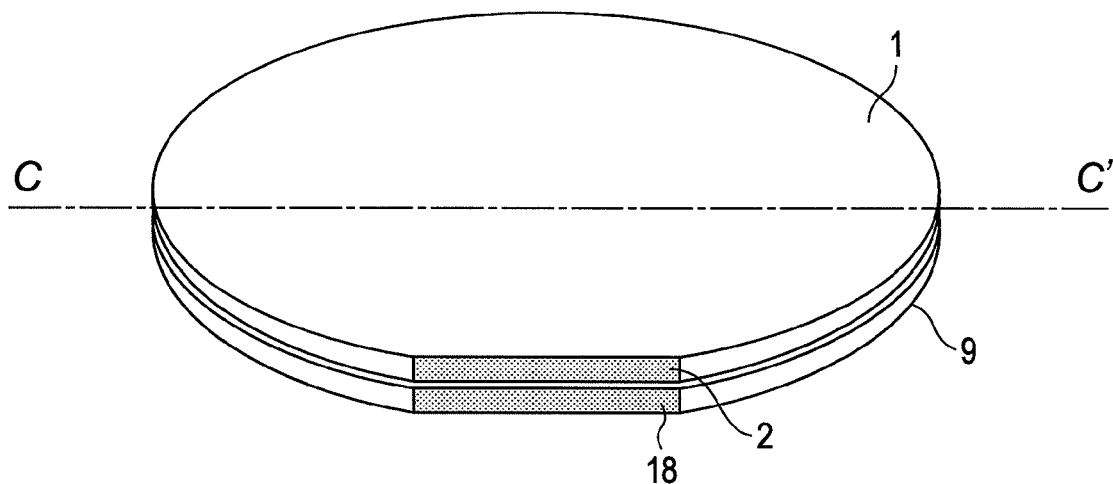
FIG. 5 is a diagram depicting a step of boding wafers in the first embodiment.
Figure 6:
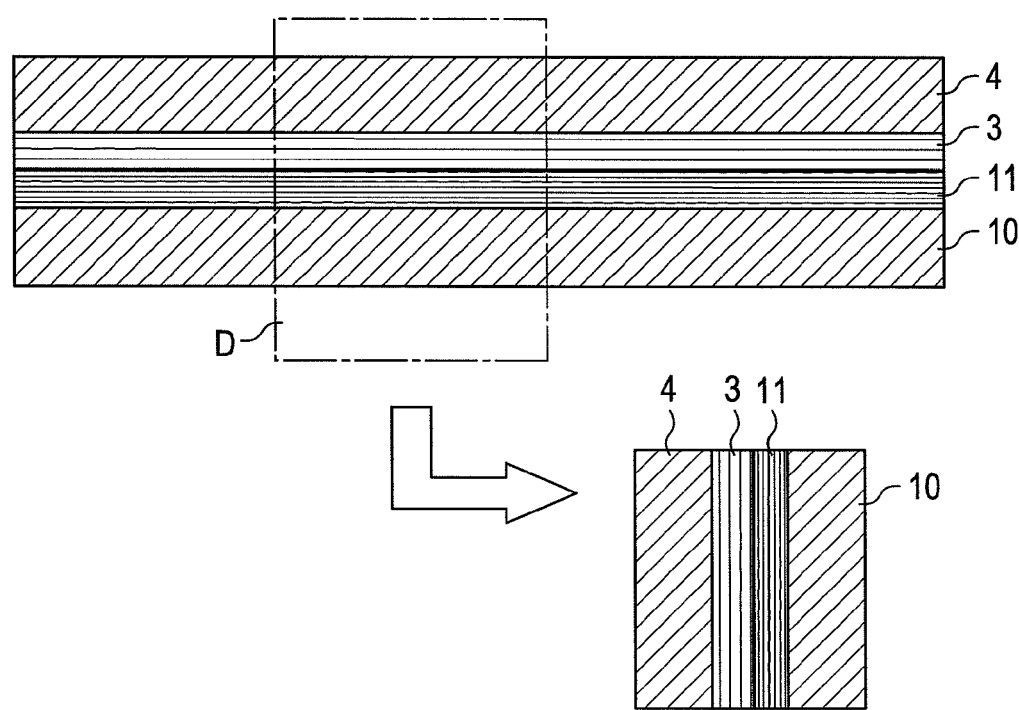
FIG. 6 is a cross-sectional view along C-C' line in FIG. 5, also showing a rectangular section D rotated by 90 degrees.

Next step is to bond the multi-layer structures of the above two substrates 1, 9 (step S103). FIG. 5 and FIG. 6 depict a method of bonding the wafers in the first embodiment. FIG. 5 is a perspective view of the two substrates 1, 9 and FIG. 6 is a cross-sectional view along C-C' line in FIG. 5, also showing a rectangular section D rotated by 90 degrees. The two substrates 1, 9 are held together such that the (111) surfaces of the two substrates 1, 9 are aligned in the same orientation, that is, orientation flats 2, 18 of the (111) surfaces are aligned with each other, as shown in FIG. 5, and the multi-layer structures 3, 11 of each substrate abut on each other, as shown in FIG. 6 (FIG. 6A, FIG. 6B). FIG. 6A shows a cross section along C-C' line in FIG. 5 and FIG. 6B is an enlarged view of a rectangular section in FIG. 6A rotated by 90 degrees. Then, these two substrates 1, 9 are placed in a heating furnace, heated at about 1000° C., and stuck together by bonding.

Figure 7:
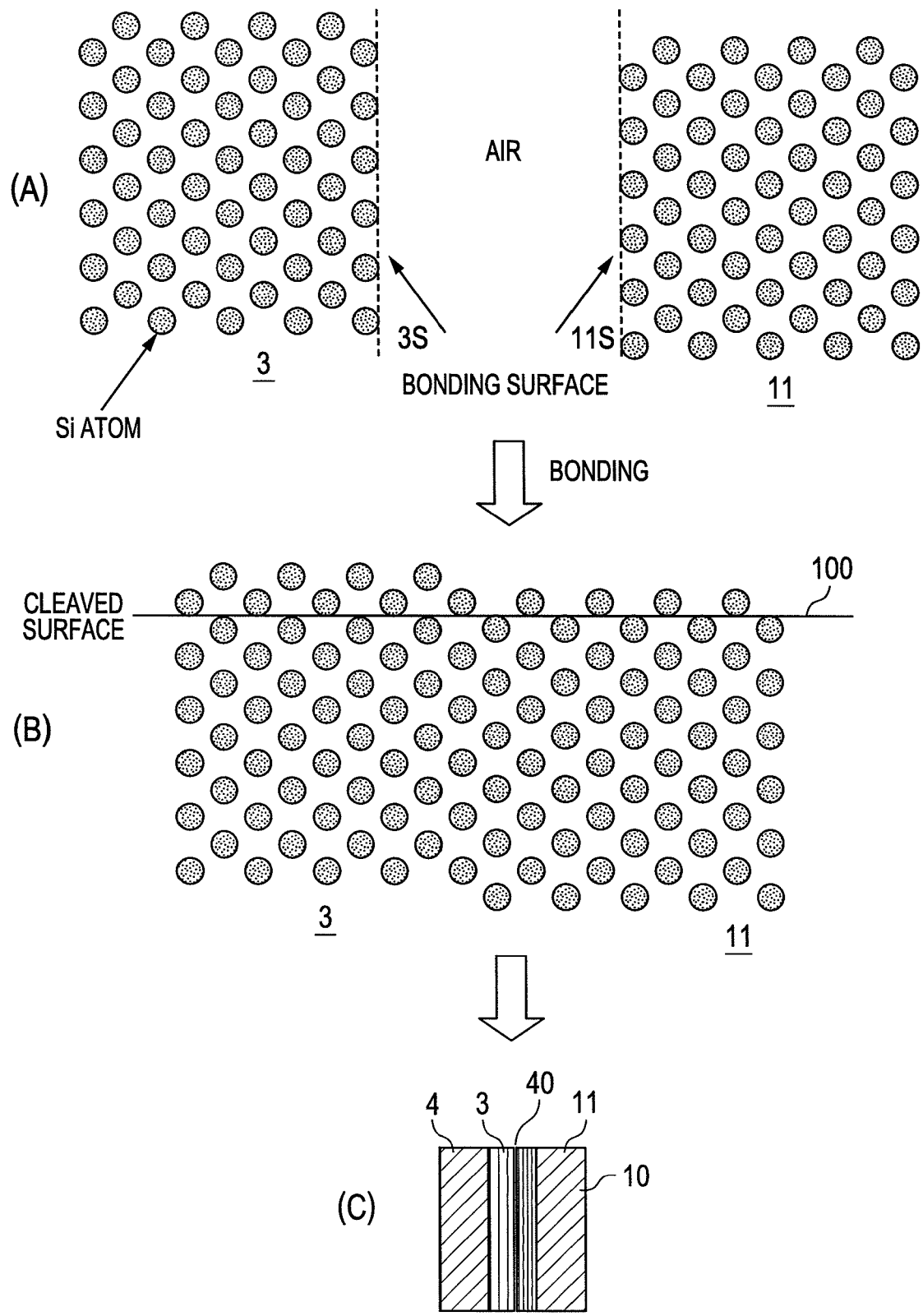
FIG. 7 is a diagram to explain an example of bonding in the present invention in a case where the surface layers of two opposing substrates are single crystal silicon.
Figure 8:
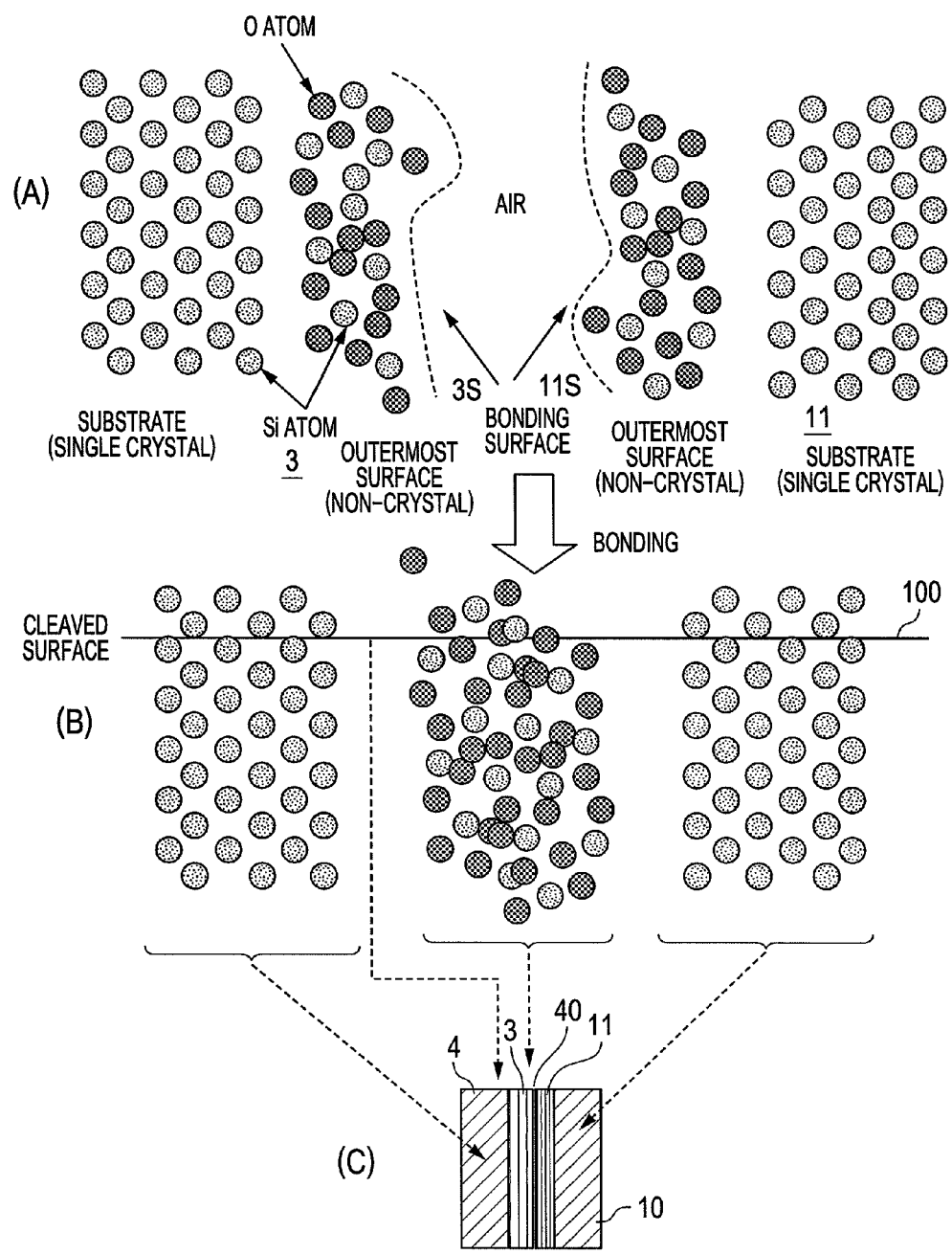
FIG. 8 is a diagram to explain an example of bonding in the present invention in a case where the surface layers of two opposing substrates are non-crystal oxide film.

An example of the bonding of the present invention is described in greater detail, using FIG. 7 and FIG. 8. As previously noted, the bonding in the present invention means a bonding method in which, in a state that atoms are arranged in the surface layers of two opposing substrates 4, 10, discontinuous boundaries between the atom arrangement in the outermost surface layer of each substrate and air exist, sandwiching the air, before the bonding and these boundaries disappear after the bonding, and the atom arrangements in the outermost surface layers of the two opposing substrates turn into a continuous atom arrangement state. For example, if the surface layers of the two opposing silicon substrates are single crystal silicon, as shown in FIG. 7, in a state that single crystal atoms are arranged, discontinuous boundaries 3S, 11S between the atom arrangement in the outermost surface layer of each substrate and air exist, sandwiching the air, before the bonding and these boundaries disappear after the bonding, and the atom arrangements in the outermost surface layers of the two opposing substrates turn into a continuous arrangement of single crystal atoms of silicon. This is like one single crystal substrate in which the positions of the above boundaries cannot be identified and the cleaved surface 100 becomes a plane on an atomic level.

Similarly, if the surface layers of the two opposing silicon substrates are non-crystal (amorphous) oxide film, as shown in FIG. 8, in a state that atoms are arranged randomly, discontinuous boundaries 3S, 11S between the atom arrangement in the outermost surface layer of each substrate and air exist, sandwiching the air, before the bonding and these boundaries disappear after the bonding, and the atom arrangements in the outermost surface layers of the two opposing substrates turn into a continuous random arrangement of non-crystal oxide film atoms. This is like one single crystal substrate in which the positions of the above boundaries cannot be identified and, again, the cleaved surface 100 becomes vertically a monolithic plane on an atomic level, because of a single atomic level in a vertical direction in FIG. 8, even though the atom arrangements from the right and left substrates are misaligned, depending on the atom arrangements in the two substrates.

In other words, in regard to combination of the substrates 1, 9 that are bonded together in the present invention, it is preferable that both are single crystal substrates including Si in the substrate surface layer or non-crystal (amorphous) substrates including Si. Moreover, in the present embodiment, the material of the multi-layer film structure of each substrate is not only silicon Si. Other single crystal or amorphous substrates including Si such as SiC may be used.

Next, after thus bonding the two substrates, aligning the orientation flats 2, 18 of the (111) surfaces of the silicon substrates 1, 9 of the same orientation (110), dicing is performed and a further step is to make (111) cross-section surfaces by cleaving or dicing.

Figure 9:
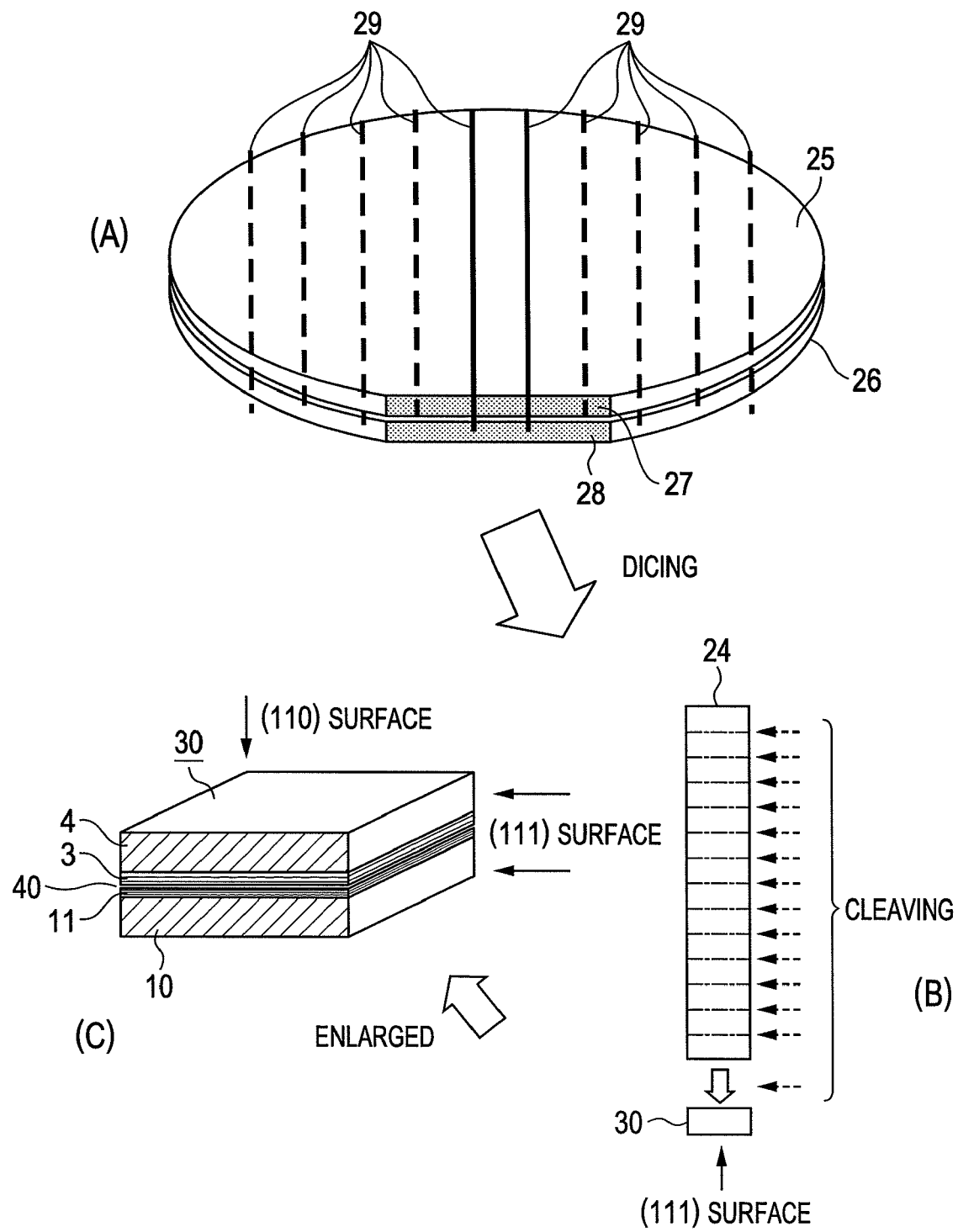
FIG. 9 is a diagram to explain a process of fabricating the standard member in the first embodiment of the invention.

FIG. 9 is a diagram to explain a process of fabricating the standard member in the first embodiment. First, as shown in FIG. 9(A), the samples 1, 9 bonded together are, cut into sample pieces 24 with a predetermined width, e.g., a width of 10 nm perpendicularly to the orientation flats 2, 18 of the (111) surfaces (step S104). That is, by dicing or the like, the samples are cut along a plurality of cut lines 29 defining the predetermined width into sample pieces 24.

Figure 10:
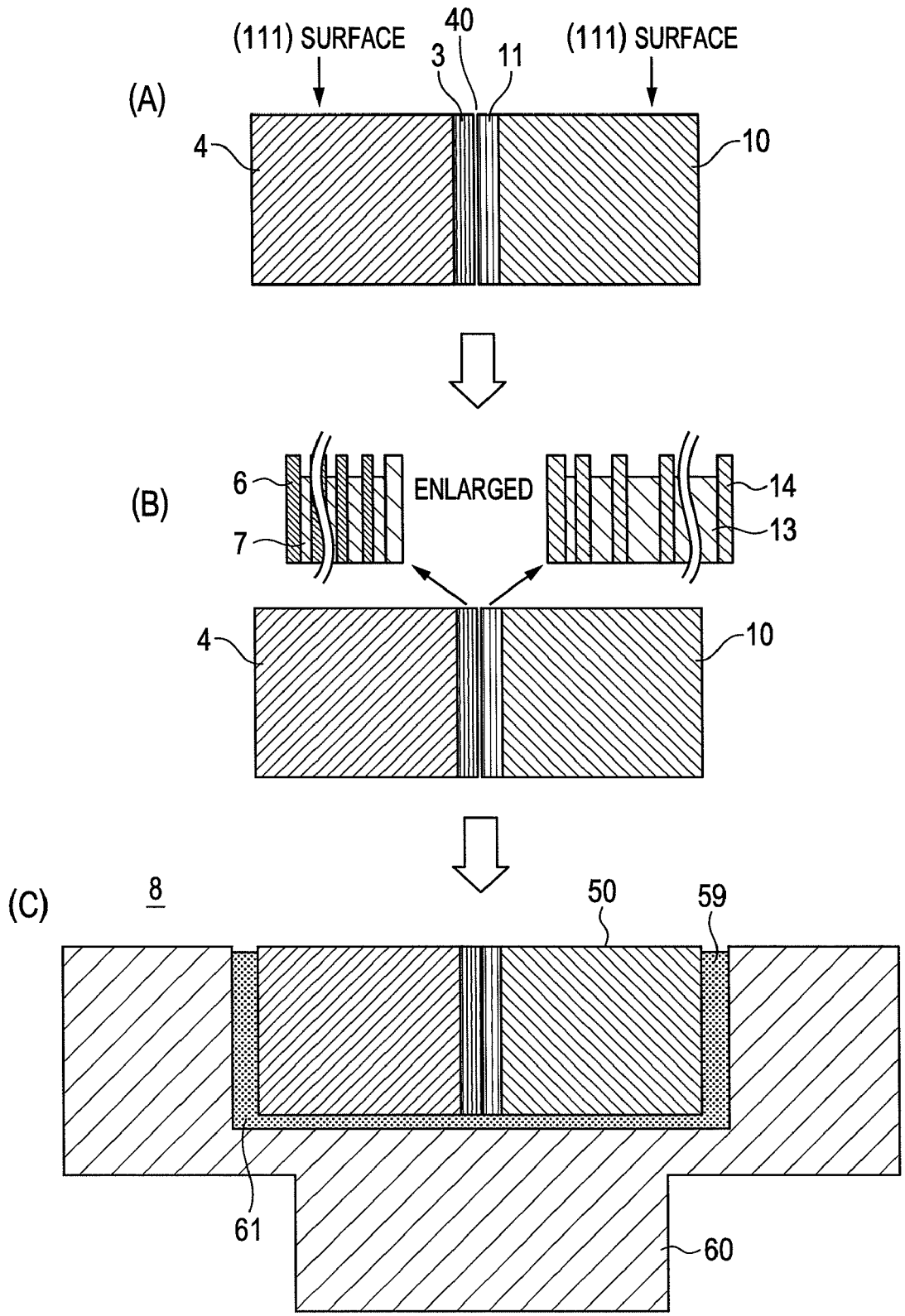
FIG. 10 is a diagram to explain a process of producing the standard member in the first embodiment of the invention.

Then, as shown in FIG. 9(B), a sample piece 24 thus cut off is separated into plural sample cubes 30 by cutting to a predetermined length, e.g., a length of 5 mm by cleaving or dicing using laser or other means, thus making (111) cross-section surfaces (step S105). At this time, the cross-section surfaces of a sample cube 30 thus cleaved or diced in its longitudinal direction become (111) surfaces vertical to the (110) surfaces which are the surfaces of the two substrates, as shown in FIG. 9(c) and FIG. 10.

Next, material selective etching of the sample cube 30 is performed (step S106). FIG. 10(A) depicts the sample cube 30 before being etched. By selectively etching the appropriate (111) surface of the sample cube 30, the silicon oxide film layers 7 are etched to a depth of about 20 nm, so that line patterns, namely, periodic convexity patterns (magnification calibration pattern 400) and uneven pitch convexity patterns (electron optics adjustment pattern 410) of the silicon layers 4 are formed. That is, etching is performed by immersing the sample cube 30 with predetermined dimensions, e.g., 10 mm wide and 5 mm long after being separated in a fluorine solution. As a result shown in FIG. 10(B), in the cross-section surface of the (111) surface side of the sample cube 30, only the silicon oxide film layers 7, 13 on the cleaved cross-section surface are etched to a predetermined depth, e.g., a depth of about 20 nm.

In consequence, in the cross-section surface of the sample cube 30, on either side of a bonding position 40 at which superlattice patterns 3, 11 are bonded together, more specifically, the silicon layers 5, 12 are bonded together, in the cross-section surface of one substrate 4 side, periodic convexity patterns (line patterns) 400 of silicon layers are formed as the constant pitch pattern region. In the cross-section surface of the other substrate 10 side, 5 nm wide convexity patterns (line patterns) of silicon layers which are arrayed at decreasing pitches toward the deposition surface (bonding position) are formed as the region of electron optics adjustment pattern 410 for the electron microscope. Since the electron optics adjustment pattern is configured not including a pattern in which a pitch linewidth is equal to or an integral multiple of the pitch linewidth of the concavity and convexity pattern for magnification calibration, it has no influence on the measuring precision of the light or x-ray diffraction. On the cross-section surface of the silicon substrate 10, the pattern position identification mark pattern 79 is provided separately.

As described hereinbefore, the (110) or (100) oriented silicon substrate 4 including the magnification calibration pattern and the (110) or (100) oriented silicon substrate 10 including the electron optics adjustment pattern are bonded, while aligning the plane directions of the surfaces of the two substrates in the same orientation. Further, a sample cube 30 is made by cleaving or dicing so that the (111) surfaces or (110) surfaces of the bonded substrate become cross-section surfaces. By selectively etching one layer of each periodic pattern, the standard member 50 with no level difference and no damage to superlattice patterns and having a constant pitch concavity and convexity electron optics adjustment pattern periodic pattern in the cross-section surface vertical to the substrate surface is obtained.

As shown in FIG. 10(C), this etched bonded cross-section sample 50 is fit in a recess 61, which is 1.45 mm wide and 5 mm deep, of a retaining holder 60 with predetermined dimensions, e.g., 20 mm high and 20 mm in diameter, so that the surfaces of the cross-section sample mate to the surfaces of the holder, and infixed in the holder by attaching it to the hold using an electrically-conductive adhesive 59 or other means; the standard member 8 is then completed (step S107).

Then, this standard member 8 was subjected to a diffraction angle measurement by an x-ray diffraction method using an x-ray with a wavelength of 0.15 nm. Sharp diffracted rays of third and higher order, unaffected by the electron optics adjustment pattern, were obtained and a pitch linewidth of 21.01 nm was obtained as a pitch of convexity patterns (line patterns) of constant pitch silicon layers 2. This pitch linewidth was obtained as an average value for the concavity and convexity patterns (line patterns) across the surface of the cross-section sample 12 irradiated by x-ray during the measurement. This pitch linewidth is obtained (evaluated) as data relevant to the standard member 8 and stored in the appropriate memory (step S108).

In the present embodiment, the magnification calibration pattern has a fixed pitch between layers, which falls in a range from 2 nm to 90 nm and the electron optics adjustment pattern has variable pitches between layers, which fall within a range of 1 nm to 100 nm. At a first standard magnification of the scanning electronic microscope, a horizontal distance between the magnification calibration pattern region and the electron optics adjustment pattern region with respect to incident electrons can fall within 10 μm.

Furthermore, the electron optics adjustment pattern region includes a periodic pattern whose pitch linewidth is other than the pitch linewidth between layers and its integral multiple in the magnification calibration pattern region.

In the present embodiment, the pattern for magnification calibration pattern formed on the cross-section surface vertical to the substrate surface can also defined as follows. More specifically, there are provided the pattern region for magnification calibration including a concavity and convexity pattern on the multi-layer film cross-section surface, formed by depositing different materials in layers periodically at a constant fixed pitch between layers, and the pattern region for electron optics adjustment including a concavity and convexity pattern on the multi-layer film cross-section surface, formed by depositing different materials in layers at variable pitches between layers, in which the pitch linewidth changes toward one direction. The two concavity and convexity patterns in the pattern region for magnification calibration and in the pattern region for electron optics adjustment are disposed so as to be adjoining on one axis and on substantially the same level. The variable pitches between layers in the pattern region for electron optics adjustment includes at least one pitch linewidth for rough adjustment, which is larger than the fixed pitch between layers in the pattern region for magnification calibration and at least one pitch linewidth for finer adjustment, which is smaller than the fixed pitch between layers in the pattern region for magnification calibration.

Although two (110) oriented silicon substrates are used in the above-described embodiment, a similar effect is also obtained through the use of (100) oriented silicon substrates. In the case that (100) oriented silicon substrates are used, the cleaved surfaces in step S104 becomes (110) surfaces vertical to the (100) surfaces which are the surfaces of the two substrates.

Although the silicon layers formed as the outermost surface layers are heated, melted, and bonded together in the method of bonding the two substrates in the above-described embodiment, the bonding is not restricted to this method. A similar effect is also obtained through the use of an anodic bonding step of bonding the oxide film surface of either one substrate and the silicon surface of either other substrate by applying a voltage of several hundred volts (V) and heating or a step of bonding at normal temperature, which bonds both silicon surfaces or oxide film surfaces of the substrates after activating the surfaces by an ion beam irradiation in a vacuum.

Both silicon substrates are bonded by means of bonding without using an adhesive agent, while aligning the plane directions of the surfaces of the two substrates in the same orientation. Consequently, the surfaces of the two substrates continue in the bonding part and this part has a mirror surface like a single substrate; in other word, there is no interface in the bonding plane. This eliminates the possibility of occurrence of a problem in which parts of superlattice patterns are harmed or become foreign materials due to an adhesive agent, which may occur in a case where two substrates are bonded together using an adhesive agent, as has been done in the past. In applications for which calibration error requirements are not strict, quite a dilute adhesive agent may be used in the step of bonding together one (110) or (100) oriented silicon substrate 4 including the magnification calibration pattern and the other (110) or (100) oriented silicon substrate 10 including the electron optics adjustment pattern.

Although the orientation flats of the (111) surfaces are used as a benchmark for aligning the plane directions when bonding two substrates, notches indicating the positions of the (111) surfaces may be used. By experiment, when notches were used, a good alignment precision with an orientation angle error within 0.1 degrees as well as the above-described embodiment was achieved.

According to the present embodiment, it is possible to dispose the magnification calibration pattern on a vertical cross-section surface and a flat plane, which avoids the occurrence of local surface electric field distribution in a level difference part, and an accurate magnification calibration can be carried out. It is possible to provide a standard member for calibration allowing magnification calibration for use in an electron microscope to be performed with high precision. According to the present embodiment, a calibration error can be decreased to fall within about 0.02 nm. Further, because two substrates can be bonded together without a gap, the pattern for electron optics adjustment for giving the electron microscope high resolving power is disposed on the cross-section surface of the second substrate and the magnification calibration pattern and the electron optics adjustment pattern are situated very close to each other with the distance between them being within 10 micrometers falling within a beam deflection range and on the same level, that is, in the same focal position. Thereby, it is possible to provide a standard member for calibration providing flatness and avoiding the occurrence of local surface electric field distribution in a level difference part, and enabling magnification calibration with a beam adjusted with high precision and remaining as is.

Second Embodiment

Figure 11A:
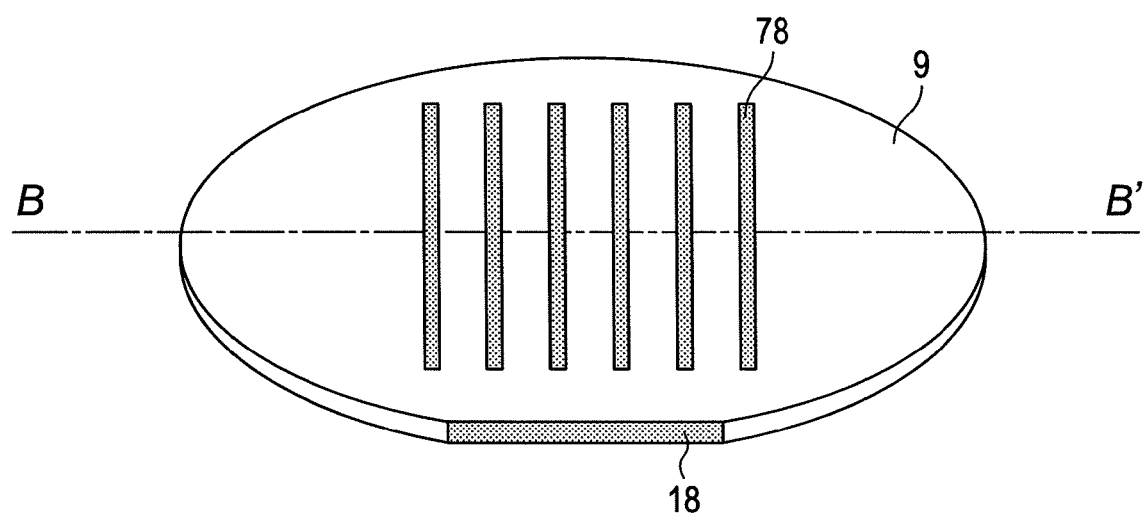
FIG. 11A is a perspective view of a substrate 9 in a second embodiment of the preset invention.
Figure 11B:
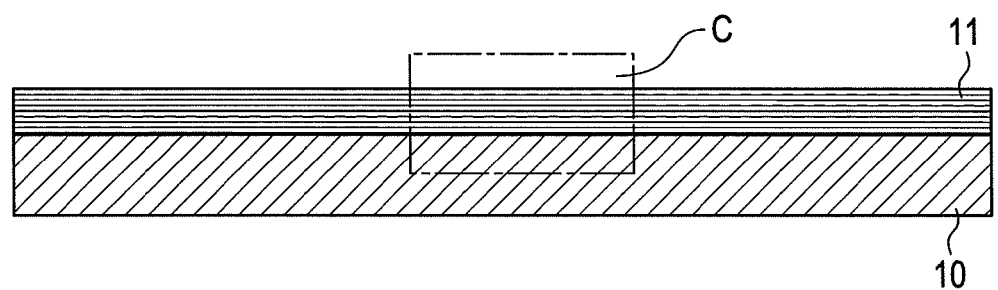
FIG. 11B is a cross-sectional view along B-B' line in FIG. 11A.
Figure 11C:
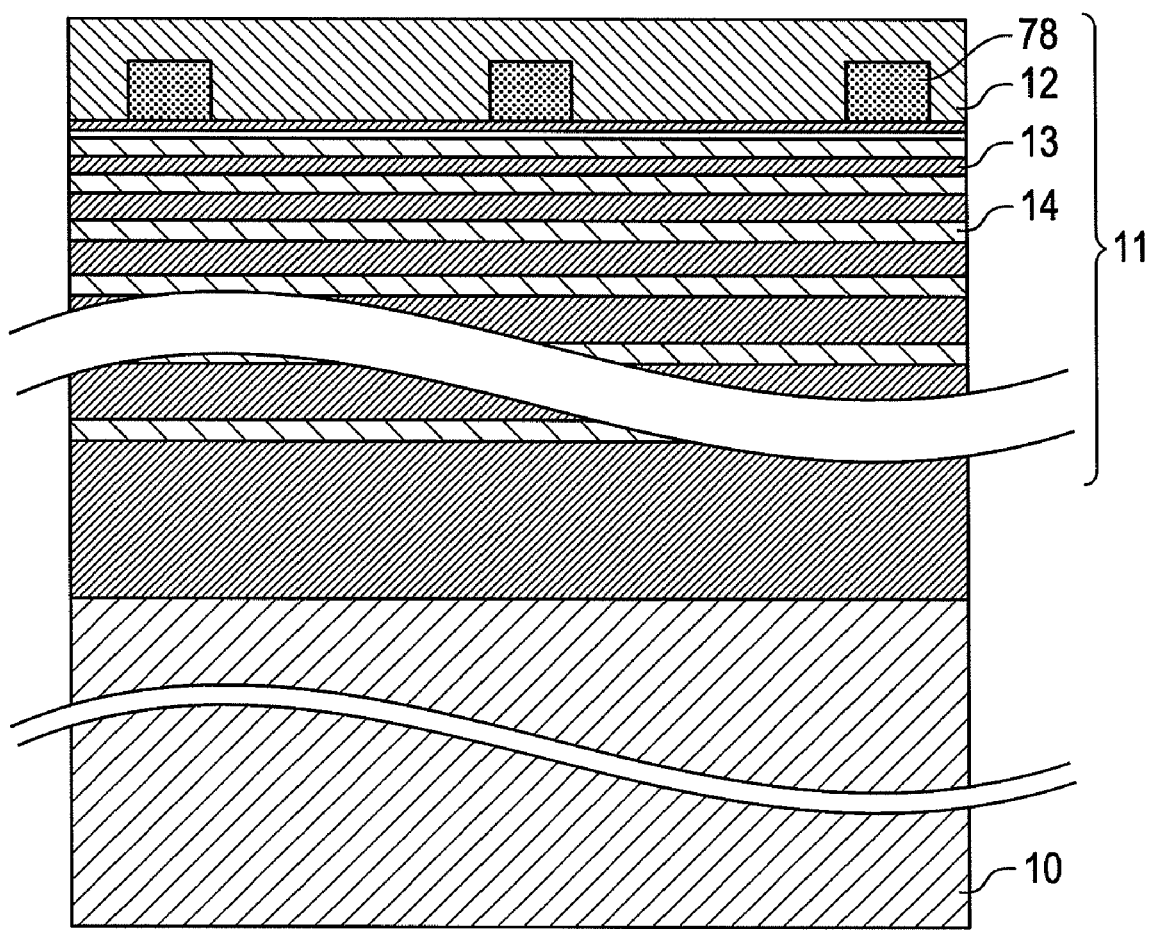
FIG. 11C is an enlarged view of a rectangular section C in FIG. 11B.
Figure 12A:
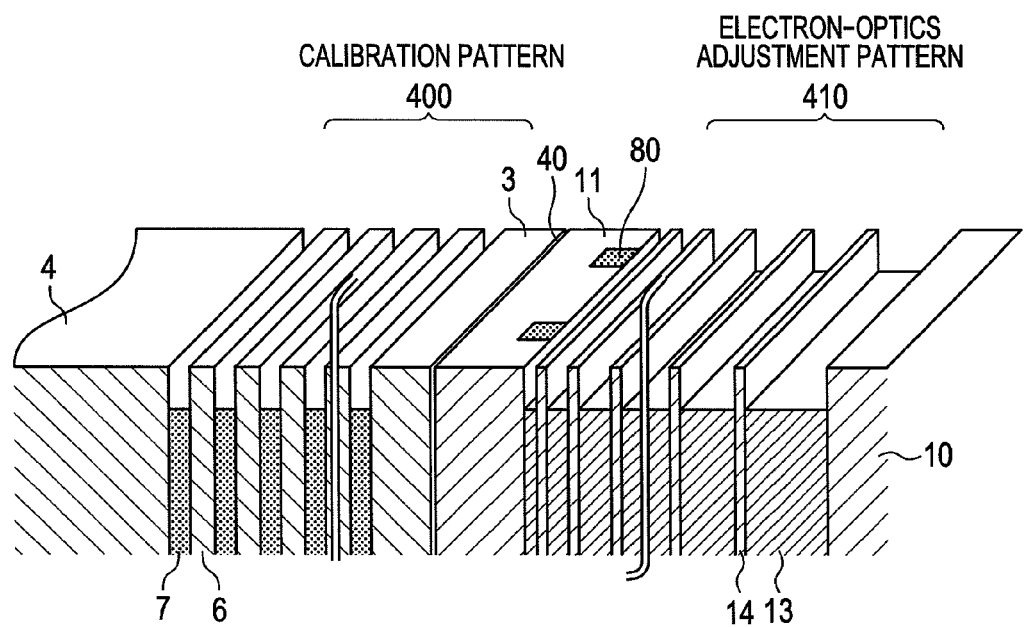
FIG. 12A is a schematic view of a standard member for calibration of the second embodiment, which is also an enlarged view of a calibration pattern area in FIG. 12B.
Figure 12B:
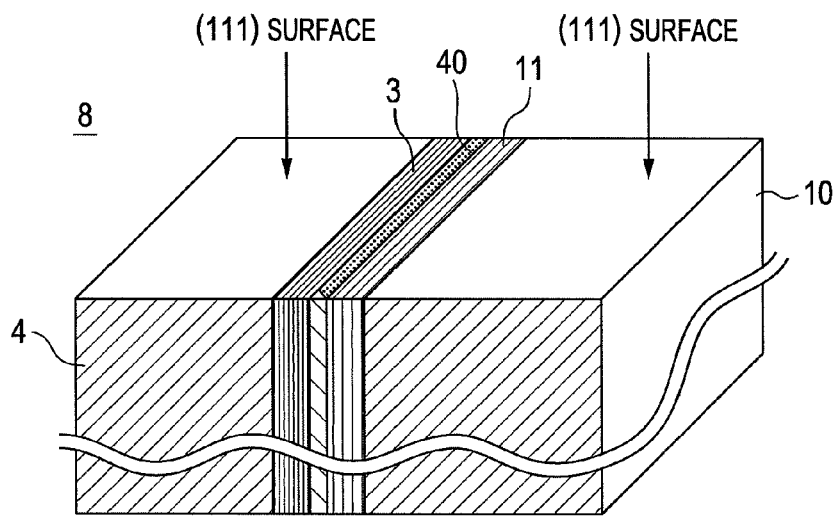
FIG. 12B is a perspective showing the entire calibration pattern in the second embodiment.

A standard member illustrative of a second embodiment of the present invention is described using FIGS. 11 and 12. FIG. 11 (FIGS. 11A to 11C) depict a process of producing a substrate 9 for electron optics adjustment pattern. FIG. 11A is a perspective view of the substrate 9, FIG. 11B is a cross-sectional view along B-B' line in FIG. 11A, and FIG. 11C is an enlarged view of a rectangular section C in FIG. 11B. FIG. 12 (FIGS. 12A and 12B) schematically depict the standard member for calibration of the second embodiment. FIG. 12B is a perspective view showing the entire calibration pattern and FIG. 12A is an enlarged view of a calibration pattern area in FIG. 12B. The standard member for calibration of the second embodiment has calibration position identification mark patterns 80 on its cross-section surface.

Then, the process of producing the standard member for calibration of the second embodiment is described. In this process of producing the standard member for calibration, a process of fabricating the calibration pattern region 400 (step S101) in the process flow shown in FIG. 1 with regard to the foregoing first embodiment is the same as in the first embodiment and a process of fabricating the substrate 9 for the electron optics adjustment pattern 410 (step S102) is partially modified. That is, over the surface of an 8-inch, (110) oriented silicon substrate 10 having a predetermined thickness, e.g., 725 μm thick, as a multi-layer structure 11 of silicon layers 13 and silicon oxide film layers 14, 20 silicon oxide layers 14 whose thickness is increased in 2 nm steps from a predetermined thickness, e.g., 2 nm up to a thickness of 40 nm are formed at uneven pitches and silicon layers 13 which are e.g., 5 nm thick are formed at a predetermined constant pitch; the multi-layer structure is formed by alternately depositing the silicon layers 13 and silicon oxide film layers 14 by sputtering deposition (correspond to step S102).

Then, as shown in FIG. 11A, over the surface of this substrate 9, tungsten wiring lines 78 which are, e.g., 100 nm wide and 50 nm thick, sufficiently larger than line patterns, are formed at a predetermined pitch, e.g., a pitch of 2 μm in a direction perpendicular to the orientation flats of the (111) surfaces by deposition, lithography, and dry etching. Finally, a silicon layer 12 with a predetermined thickness, e.g., 100 nm thick is formed by sputtering deposition as a top layer and, after that, the top layer is planarized by chemical and mechanical abrasion.

Subsequently, according to virtually the same fabrication process as for the first embodiment, the substrate 4 produced by step S101 and the substrate 10 produced by the step S102 are held together such that the multi-layer structures 3, 11 abut on each other and the orientation flats 18 of the (111) surfaces are aligned.

Then, the two substrates are stuck together by bonding at normal temperature in which bonding is performed after activating the surfaces of the substrates by ion beam irradiation in a vacuum (step S103). As the bonding method, another bonding method mentioned in the first embodiment section can also be adopted.

As is the case for the first embodiment shown in FIG. 9(A), the thus bonded samples are then cut into sample pieces 24 with a predetermined width, e.g., 10 mm wide along a plurality of cut lines 24 perpendicularly to the orientation flats of the (111) surfaces (step S104). Further, a 10 mm wide sample piece thus cut off is separated into 5 mm long cubes by cleaving, thus making a sample cube 30 (step S105). At this time, as shown in FIG. 12B, cross-section surfaces which are 10 mm wide in the longitudinal direction are (111) surfaces vertical to the (100) surfaces which are the surfaces of the two substrates.

Etching is performed by immersing this sample cube 30 after being separated, the sample cube which is, e.g., 10 mm wide and 5 mm long after being separated in a fluorine solution (step S106). As a result, only the silicon oxide film layers 7, 13 on the cleaved cross-section surface are etched to a depth of about 20 nm. In consequence, on either side of a bonding position 50 at which superlattice patterns are bonded together, more specifically, the silicon layers are bonded together, in the cross-section surface of one substrate side, periodic convexity patterns (line patterns) of silicon layers are formed. In the cross-section surface of the other substrate side, 5 nm wide convexity patterns (line patterns) of silicon layers which are arrayed at decreasing pitches toward the deposition surface (bonding position) are formed as the region of electron optics adjustment pattern for the electron microscope. On this cross-section surface, calibration position identification mark patterns 80 are arranged which correspond to the cross-section surfaces of the tungsten wiring lines 78 which are 100 nm wide and 50 nm thick and spaced at a pitch of 2 μm, produced at step S102.

This etched bonded cross-section sample 12 is fit in a recess 61, which is 1.45 mm wide and 5 mm deep, of a retaining holder 13 which is 20 mm high and 20 mm in diameter, so that the surfaces of the cross-section sample mate to the surfaces of the holder, and infixed in the holder using an electrically-conductive adhesive; the standard member is then completed (step S107).

This standard member was subjected to a diffraction angle measurement by an x-ray diffraction method using an x-ray with a wavelength of 0.15 nm. Sharp diffracted rays of third and higher order, unaffected by the electron optics adjustment pattern, were obtained and a pitch linewidth of 21.01 nm was obtained as a pitch of convexity patterns (line patterns) of constant pitch silicon layers 2, as is the case for the first embodiment. This pitch linewidth was obtained as an average value for the concavity and convexity patterns (line patterns) across the surface of the cross-section sample 12 irradiated by x-ray during the measurement. This pitch linewidth is obtained (evaluated) as data relevant to the standard member 8 and stored in the appropriate memory (step S108).

Effects similar to those provided by the first embodiment are also obtained in the present embodiment. That is, according to the present invention, it is possible to dispose the magnification calibration pattern on a vertical cross-section surface and a flat plane, which avoids the occurrence of local surface electric field distribution in a level difference part, and an accurate magnification calibration can be carried out. As such, it is possible to provide a standard member for calibration allowing magnification calibration for use in an electron microscope to be performed with high precision. Further, because two substrates can be bonded together without a gap, the pattern for electron optics adjustment for giving the electron microscope high resolving power is disposed on the cross-section surface of the second substrate and both the magnification calibration pattern and the electron optics adjustment pattern are situated very close to each other with the distance between them being within 10 micrometers falling within a beam deflection range and on the same level, that is, in the same focal position. Thereby, this provides flatness, avoids the occurrence of local surface electric field distribution in a level difference part, and enables magnification calibration with a beam adjusted with high precision and remaining as is.

Further, according to the present embodiment, because two substrates can be bonded together without a gap, the mark patterns making a calibration position identifiable are disposed on the cross-section surface of the second substrate and the magnification calibration pattern and the mark patterns are situated very close to each other within 10 micrometers falling within a beam deflection range and on the same level, that is, in the same focal position. Thereby, it is possible to provide a standard member for calibration that allows a magnification calibration position once used to be recognized easily and can prevent the calibration precision from deteriorating due to contaminations brought in by repeated use.

Third Embodiment

Next, descriptions are provided for an example where the standard member 8 having the cross-section sample 50 of the multi-layer structure of silicon/silicon oxide film layers, fabricated according to the second embodiment, placed in the holder 60, was mounted in a scanning electronic microscope and calibration was performed.

Figure 13:
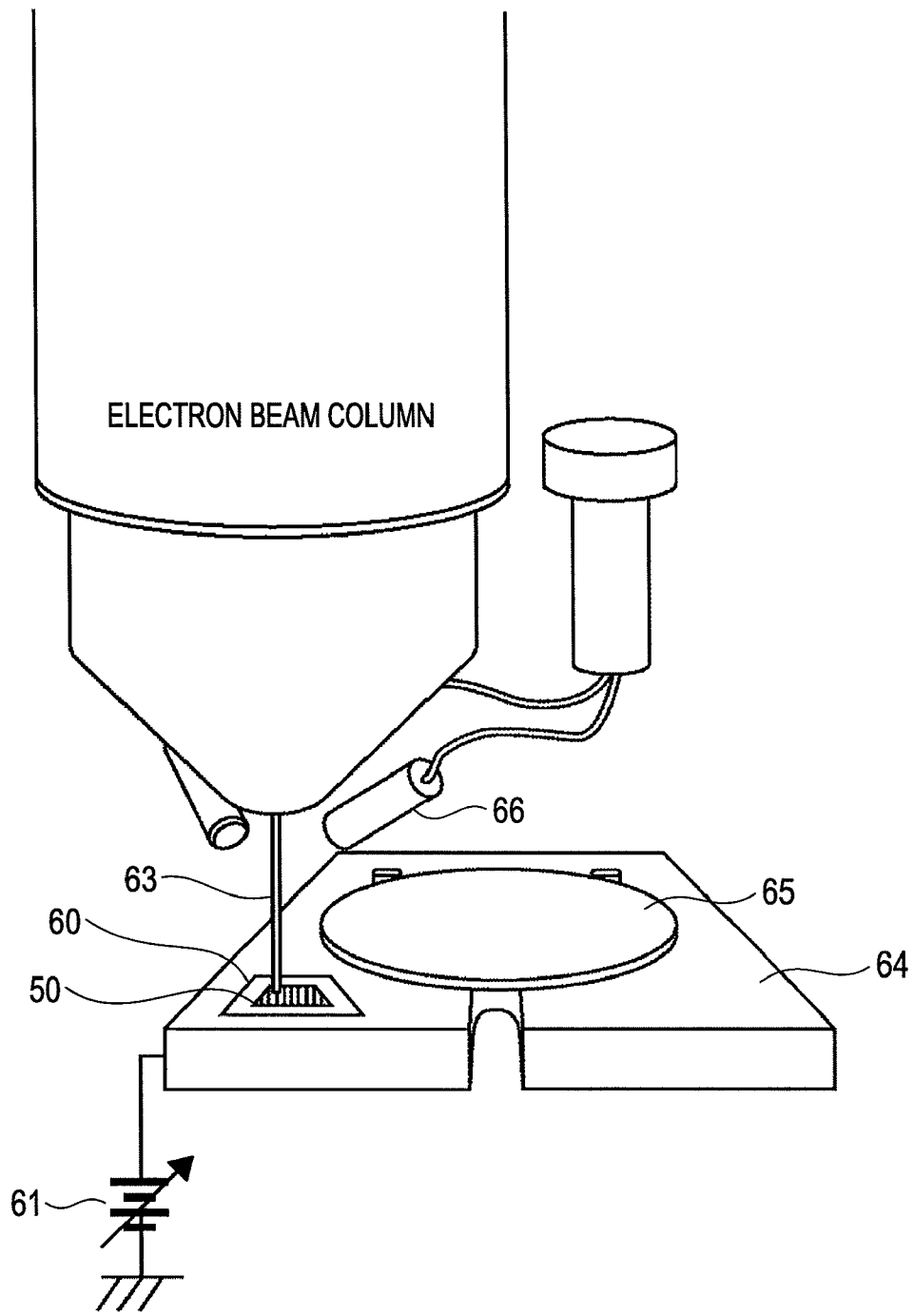
FIG. 13 is an enlarged perspective view of a stage part of a scanning electronic microscope in a third embodiment of the invention.
Figure 14:
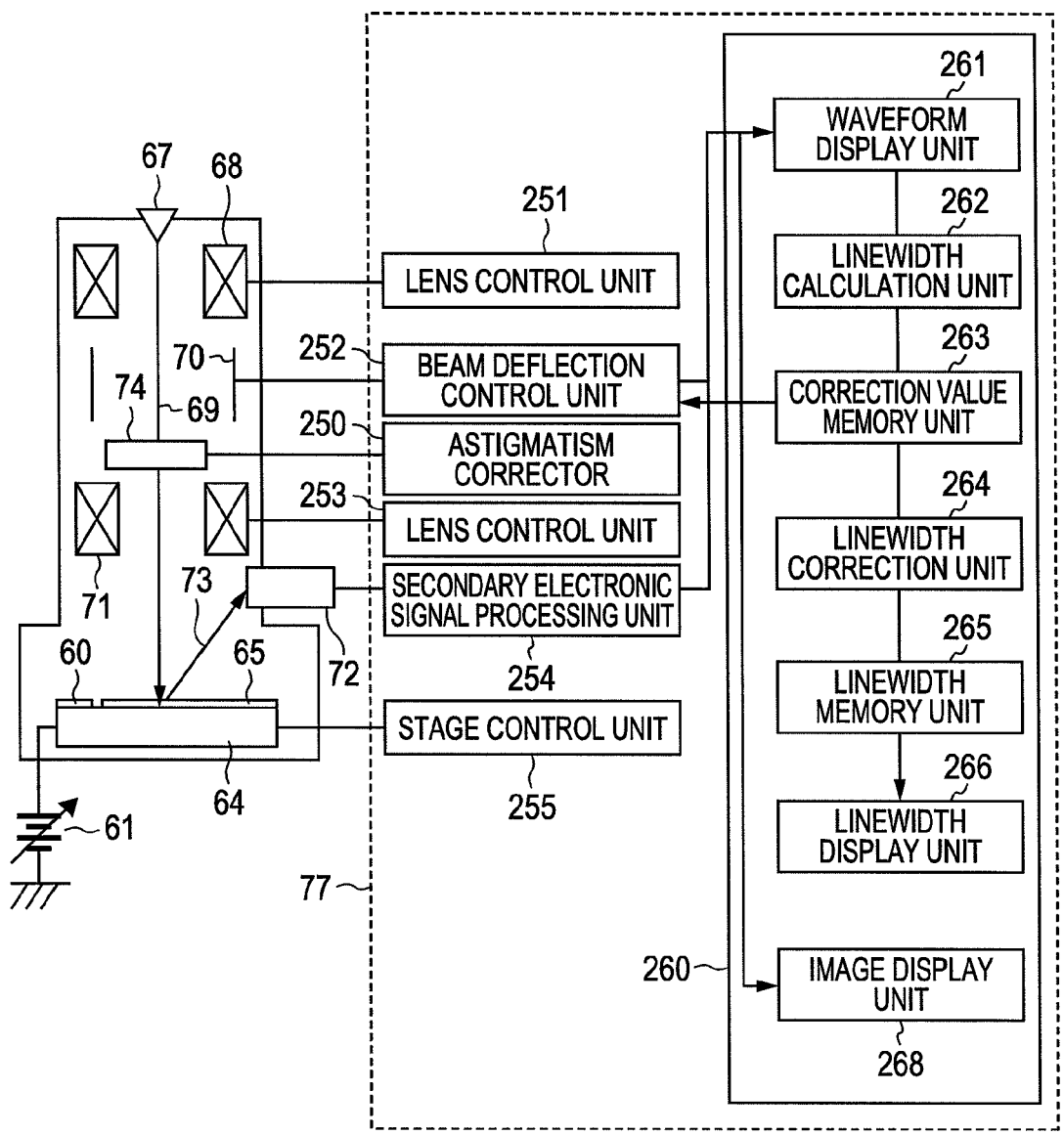
FIG. 14 is a schematic view showing a system configuration of the scanning electronic microscope to which the third embodiment is applied.
Figure 15:
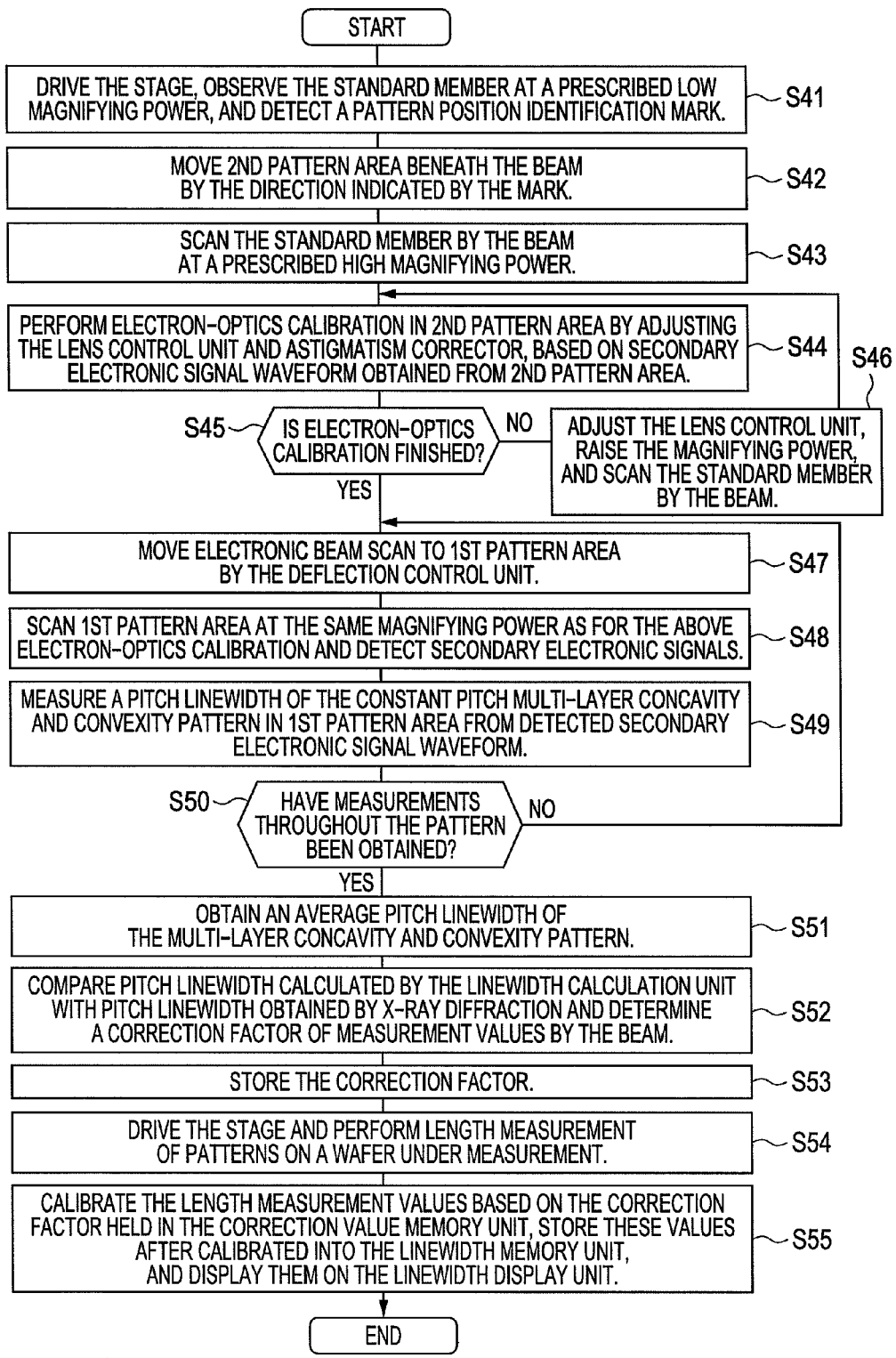
FIG. 15 is a flowchart when magnification calibration of the scanning electronic microscope is performed according to the third embodiment.

FIG. 13 is an enlarged perspective view of a stage part of a scanning electronic microscope according to the present invention. FIG. 14 is a schematic view showing a system configuration of the scanning electronic microscope. FIG. 15 is a flowchart when magnification calibration of the scanning electronic microscope is performed.

As shown in FIGS. 13 and 14, in the present embodiment, the standard member 8 described in the first embodiment section or the second embodiment section is mounted on a stage 64 of a scanning electronic microscope and calibration of the scanning electronic microscope is performed. A specimen (a wafer) to be measured 65 is also mounted on this stage 64. A bias power supply 61 that applies a voltage to control a voltage accelerating a beam 63 is also connected to this stage 64. Reference numeral 66 denotes an electron detector that detects secondary electrons 73 generated by electron beam irradiation.

Here, in FIG. 14, an example of an overall configuration of the scanning electronic microscope to which the present invention is applied is briefly described. The scanning electronic microscope comprises an electron gun (an electron source) 67 which emits an electron beam 63, a scanning deflector 70 for scanning a specimen by the electron beam 63, lenses 68 and 71 for adjusting the electron beam focus on a specimen subjected to length measurement 65, an astigmatism corrector 74, an electron detector 72 for detecting secondary electrons 73 generated by primary electron beam irradiation, an SEM control system 77 including an information processing device, etc. The SEM control system 77 is comprised of, inter alia, a lens control unit 251 which controls a lens 68, a beam deflection control unit 252 which controls scanning deflection of the primary electron beam, a lens control unit 253 which controls the lens 71, a secondary electronic signal processing unit 254 which processes an output signal from the electron detector 72, a controller 2250 which controls the astigmatism corrector 74, and a stage control unit 255 which controls movement of the stage 64 on which the specimen subjected to length measurement 65 and the standard member 8 are mounted. The information processing device 260 comprised in the SEM control system 77 is comprised of, inter alia, operational processing units based on CPU (a linewidth calculation unit 262, a linewidth correction unit 264) for operational processing of every information or control signal which is input from a SEM control unit, a memory (not shown) in which various types of software such as magnification calibration processing to run on the CPU are expanded, and external memory units (a correction value memory unit 263, a linewidth memory unit 265). Display units (a waveform display unit 261, a linewidth display unit 266, an image display unit 268) on which results of information processing by the CPU are displayed, information input means (not shown) for inputting information necessary for information processing to the information processing device, among others, are further connected to the information processing device 260.

Then, operation of the scanning electronic microscope is briefly described. A specimen is scanned by the electron beam 63 emitted from the electron gun (the electron source) 67 via the lenses 68, 71 and the deflector 70. There is the specimen (the wafer) subjected to length measurement 65 on the stage 64, 76. A voltage for controlling a beam accelerating voltage is applied to the stage 64. Based on signals from the electron detector 66, 72 which detects secondary electrons 73 generated by electron beam irradiation, a secondary electron (or a reflected electron) image or a secondary electronic signal waveform is displayed and length measurement is performed. The position of the stage at an instant of time is detected and controlled by the stage control unit. Although, in the configuration shown here in FIG. 14, each of the above calculation unit, control unit, display unit, etc. are included in the control system 77, these units may not necessarily be included in the control system 77.

Then, a procedure of a process for carrying out magnification calibration according to the present invention is described, following the flowchart of FIG. 15. First, the standard member 8 having the cross-section sample 50 of the multi-layer concavity and convexity structure of silicon/silicon oxide film layers, fabricated according to the second embodiment, placed in the holder 60, which is shown in FIG. 15, is mounted on the stage 64. As the stage is moved, pattern position identification marks 80 on the sample are detected at a first prescribed magnifying power, for example, a low magnifying power of 10,000 times (step 41). Then, the standard member 8 is scanned by the electron beam at the first prescribed magnifying power. A voltage of −1.5 kVA is applied to the stage 64 so that the beam accelerating voltage will become, for example, 500 V. Here, the first prescribed magnifying power, e.g., 10,000 times should be the magnifying power that allows the entire standard member 8 shown in FIG. 12B to be seen in the same field of view and also should be a low magnifying power that does not suit for the largest pattern in the standard member 8. Since, at this low magnifying power, multi-layer convexity patterns (line patterns) existing in the two pattern regions are too fine, it is not possible to discriminate between the calibration pattern region 400 and the electron optics adjustment pattern region 410 with the line patterns. However, it is possible to differentiate and locate the pattern regions with ease by the pattern position identification marks 80 on the sample.

Then, as the stage 64 is moved by the stage control unit, the calibration position identification mark patterns 80 (formed of the cross-section surfaces of the tungsten wiring lines 78 which are 100 nm wide and 50 nm thick and spaced at a pitch of 2 μm) are positioned beneath the beam at a magnifying power of 100,000 times (step S42). The coordinates of these marks are stored in the memory. Then, beam adjustment is performed by scanning the multi-layer concavity and convexity structure 14 of silicon/silicon oxide film layers in the electron optics adjustment pattern region 410 (step S43).

In the multi-layer concavity and convexity structure 14 of silicon/silicon oxide film layers, a trench width of 40 nm of a silicon oxide film layer, larger than 20 nm which is the pitch linewidth of the multi-layer concavity and convexity grating pattern 7 of constant pitch silicon/silicon oxide film layers could be distinguished even in the state before the beam adjustment. Thus, on the basis of this pattern with the trench width of 40 nm of a silicon oxide film layer, the lenses 68, 71 in the electron beam column are controlled by the lens control units and the astigmatism corrector 74 is adjusted; i.e., highly precise electron optics adjustment including adjustments of the astigmatism and the focal point of the beam is performed (step S44).

As a result, the multi-layer concavity and convexity structure part 14 of silicon/silicon oxide film layers of the standard member was scanned again by the beam under this beam condition and secondary electronic signal waveforms on the waveform display unit obtained through the secondary electronic signal processing unit were observed. A linewidth (trench width) of 20 nm which is the same as the pitch linewidth of the multi-layer concavity and convexity grating pattern 7 of constant pitch silicon/silicon oxide film layers could be distinguished.

When the multi-layer concavity and convexity structure 14 of silicon/silicon oxide film layers was further observed under this beam condition, a smaller trench width of 4 nm of a silicon oxide film layer, smaller than the pitch linewidth of 10 nm could not be distinguished (No at step S45). Thus, after raising the magnifying power to 400,000 times and on the basis of this pattern with the trench width of 4 nm of a silicon oxide film layer, the lenses 68, 71 in the electron beam column were controlled by the lens control units and electron optics adjustment including adjustments of the astigmatism and the focal point of the beam was performed (step S46). As a result, the trench width of 4 nm of a silicon oxide film layer could be distinguished (Yes at step S45). Since the multi-layer concavity and convexity grating pattern 7 of constant pitch silicon/ silicon oxide film layers cannot be seen in the same field of view at the magnifying power to 400,000 time, as this beam condition is maintained, the beam scanning position is moved to the multi-layer concavity and convexity grating pattern 7 of constant pitch silicon/silicon oxide film layers by beam deflection equivalent to a horizontal distance of 2 μm by using the deflector 70 having a maximum deflection range of 10 micrometers (step S47). When the above pattern 7 was scanned by the beam and secondary electronic signal waveforms on the waveform display unit obtained through the secondary electronic signal processing unit were observed, shaper secondary electronic signal waveforms from the multi-layer concavity and convexity grating pattern of constant pitch silicon/silicon oxide film layers were obtained as compared with those obtained under previous beam conditions without beam adjustment by focal point correction (step S48).

A pitch linewidth was obtained by the linewidth calculation unit from the secondary electronic signal waveforms on the waveform display unit obtained through the secondary electronic signal processing unit, resulting from scanning the multi-layer concavity and convexity grating pattern of constant pitch silicon/silicon oxide film layers by the electron beam under this beam condition (step S49). This measurement was repeated at 20 different positions in the multi-layer concavity and convexity grating pattern 7 of constant pitch silicon/silicon oxide film layers (step S50). Then, an average value of 20.10 nm of pitch linewidths measured at the 20 positions during the above measurement was stored in the linewidth memory unit (step S51). Then, the linewidth correction unit compared the pitch linewidth obtained by the linewidth calculation unit with a pitch linewidth of 21.01 nm obtained beforehand by the x-ray diffraction method and stored in the linewidth memory unit and determines a correction factor of measurement values by the beam (step S52). A correction was made in the beam deflection control unit so that the difference between both becomes 0 and the correction factor was stored in the correction value memory unit (step S53).

Meanwhile, by driving the specimen stage 64, length measurement was performed for patterns on the wafer to be measured 65 (step S54). The length measurement values were calibrated based on the above correction factor held in the correction value memory unit, displayed on the linewidth display unit and the image display unit, and stored (step S55).

Since the surface of the holder 60 and the surface of multi-layer cross-section structure 50 comprising the two patterns of silicon/silicon oxide film layers define virtually the same plane with a level difference within 1 μm, no disturbance was observed in the surface electric field produced by the voltage of −1.5 kV applied to the stage and astigmatic modulation did not take place under the beam condition on the surface of multi-layer cross-section structure comprising the two patterns of silicon/silicon oxide film layers. In consequence, a calibration precision within 0.02 nm could be obtained. There is a possibility of linewidth variation in the grating region irradiated by the beam due to contaminations brought in this region. Because the coordinates of certain positions on the cross-section surfaces of the tungsten wiring lines in the vicinity of the grating pairs used for calibration are stored during the calibration process, constantly stable apparatus calibration was enabled by using unused grating pairs on a subsequent occasion of calibration, based on such coordinates.

By contrast, in the case of a standard member of related prior art, both the concavity and convexity grating pattern of the cross-section surface of one substrate and the concavity and the convexity grating pattern of the cross-section surface of the other substrate have the same pitch linewidth or virtually the same pitch linewidth. Consequently, in the light or x-ray diffraction, diffracted rays from both the concavity and convexity grating patterns interfere with each other and sufficient intensity of diffracted rays for measurement could not be obtained. Therefore, pitch linewidths were measured by an X-ray reflection method and with a deposited film thickness meter before two cross-section surfaces are bonded together. However, in this method, since information about film thickness of layers inside the substrate other than the cross-section surfaces is added and linewidth variation resulting from fabrication is unknown because the measurement is performed before etching and bonding, pitch linewidth precision is uncertain. Consequently, the calibration precision becomes 0.5 nm or more.

According to the present embodiment, it is possible to dispose the magnification calibration pattern on a vertical cross-section surface and a flat plane, which avoids the occurrence of local surface electric field distribution in a level difference part, and an accurate magnification calibration can be carried out. It is possible to provide a standard member for calibration allowing magnification calibration for use in an electron microscope to be performed with high precision. Further, because two substrates can be bonded together without a gap, the pattern for electron optics adjustment for giving the electron microscope high resolving power is disposed on the cross-section surface of the second substrate and the magnification calibration pattern and the electron optics adjustment pattern are situated very close to each other with the distance between them being within 10 micrometers falling within a beam deflection range and on the same level, that is, in the same focal position. Thereby, it is possible to provide a standard member for calibration providing flatness and avoiding the occurrence of local surface electric field distribution in a level difference part, and enabling magnification calibration with a beam adjusted with high precision and remaining as is.

Also, according to the present embodiment, because two substrates can be bonded together without a gap, the mark patterns making a calibration position identifiable are disposed on the cross-section surface of the second substrate and the magnification calibration pattern and the mark patterns are situated very close to each other within 10 micrometers falling within a beam deflection range and on the same level, that is, in the same focal position. Thereby, it is possible to provide a standard member for calibration that allows a magnification calibration position once used to be recognized easily and can prevent the calibration precision from deteriorating due to contaminations brought in by repeated use.

Fourth Embodiment

Figure 16:
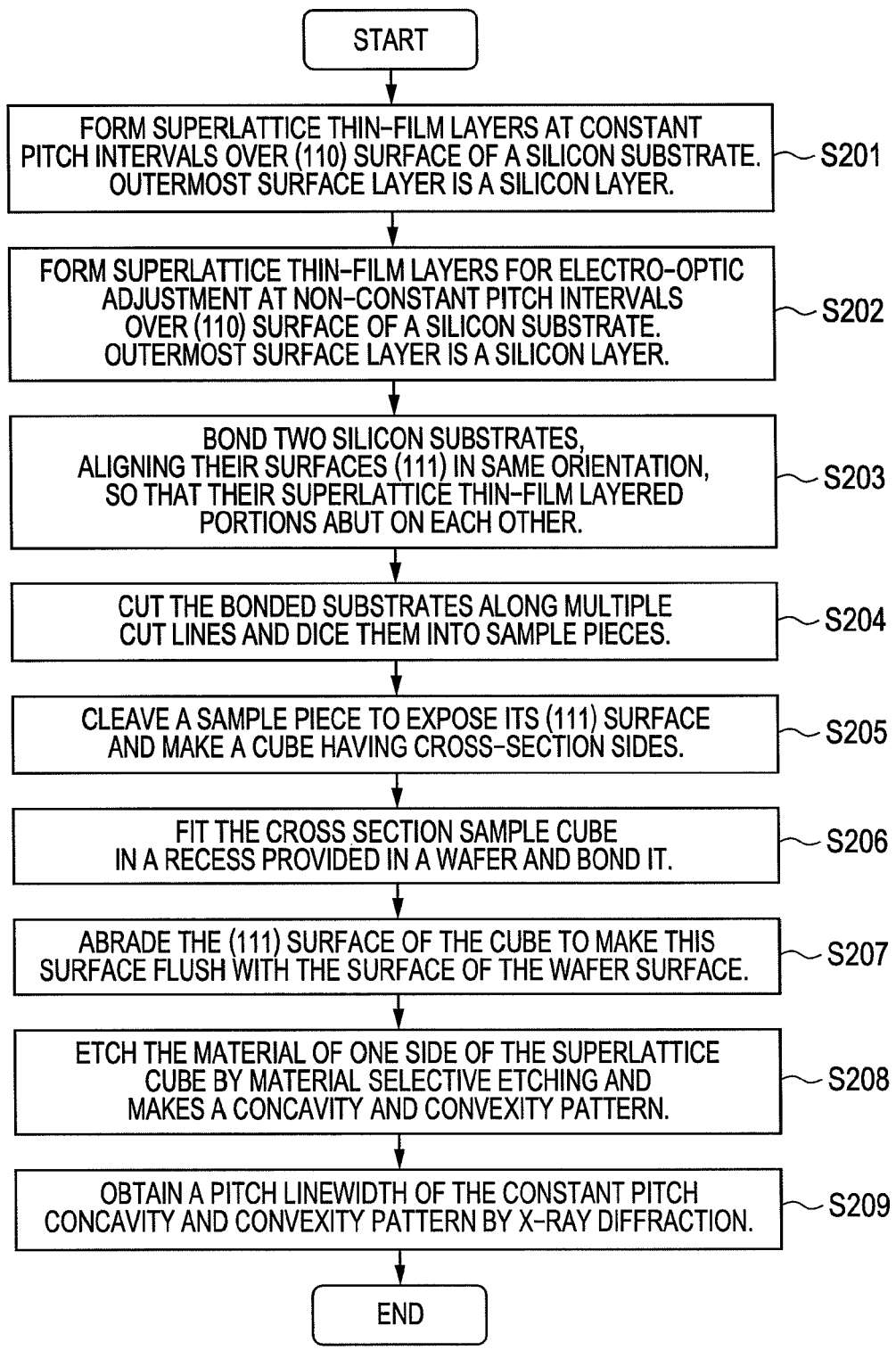
FIG. 16 is a flowchart of a process for fabricating a standard member in a fourth embodiment of the invention.

A standard member according to the present invention can also be implemented in a wafer form in which a standard member is formed integrally with a wafer having the same size as the specimen (the wafer) to be measured 65 (see FIG. 13) which is mounted on the stage 64. A method for fabricating a standard member of a fourth embodiment is described by means of a flowchart in FIG. 16 and a process diagram in FIG. 17. The process until a cross-section cube 30 (see FIG. 9) has been produced is the same as in the first embodiment. That is, steps S201 to S205 in FIG. 16 are the same as step S101 to S105 of the flowchart in FIG. 2.

Then, as shown in FIG. 17(A), the cross-section cube 30 is embedded in a recess 82 provided beforehand in a silicon substrate 87 by bonding (S206). This recess 82 is formed by etching a surface silicon layer 84 and an oxide film layer 83 of the wafer 87 to which an indwelling oxide film layer 83 is bonded and the recess 82 having a planar and clean silicon surface can be realized. By bonding together at normal temperature this clean silicon surface and a silicon surface of the standard member, multi-layer cross-section bonding can be achieved. The (111) surfaces of this cross-section cube 81 and the (100) surface which is the surface of the silicon substrate 87 are parallel to each other.

Then, as shown in FIG. 17(B), the height of the cross-section sample 30 is adjusted to be flush with the surface of the silicon substrate 87 by means of abrasion means (S207). Further, as shown in FIG. 17(C), the cross-section sample 30 is subjected to material selective etching (S208). Then, the wafer-form standard member 88 comprising the magnification calibration pattern 400 and the electron optics adjustment pattern 410 is completed. Finally, diffraction angle measurement according to the x-ray diffraction method is performed. A pitch linewidth of periodic convexity patterns (line patterns) of constant pitch silicon layers 2 is obtained and retained in the memory (step S209). In this embodiment also, the abraded surface precision is improved than before, because abrasion begins with the cleaved surface and virtually similar effects as for the holder type of the first embodiment and the second embodiment are obtained.

It goes without saying that the standard member according to the present invention can also be applied to other types of electron beam apparatus, not only to the scanning electronic microscope for length measurement shown in FIG. 14.

EXPLANATION OF REFERENCE NUMERALS

1, 4, 9, 10 . . . Silicon substrate, 3, 11 . . . Multi-layer structure part, 5, 6, 12, 13 . . . Silicon layer, 7, 14 . . . Silicon oxide film layer, 2, 18 . . . Orientation flat, 8 . . . Standard member, 24 . . . Multi-layer cross-section piece sample, 30 . . . Sample cube, 40 . . . Bonding part, 67 Electron gun, 63 . . . Electron beam, 68, 71 . . . Lens, 70 . . . Deflector, 64 . . . Stage, 65 . . . Wafer specimen to be measured, 66 . . . Detector, 73 . . . Secondary or reflected electrons, 77 . . . Control system, 78 . . . Tungsten wiring line, 80 . . . Calibration position identification mark pattern, 400 . . . Magnification calibration pattern, 410 . . . Electron optics adjustment pattern.

The invention claimed is:

1. A standard member for calibration calibrating a scanning electronic microscope, comprising:
   a bonded substrate into which a first sample cube and a second sample cube, each comprising a multi-layer film structure in which different materials are alternately deposited in layers over the surface of a substrate and its cross-section surfaces, are bonded together, their plane directions being aligned in the same orientation at the surfaces of both the multi-layer film structures; and
   a calibration pattern area defined on one of the cross-section surfaces of the bonded substrate,
   wherein a pair of concavity and convexity patterns are formed in the calibration pattern area by fabricating the each multi-layer film structure, and
   wherein the cross-section surfaces are (111) surfaces when the surfaces of the both substrates are (110) surfaces, and the cross-section surfaces are (110) surfaces when the surfaces of the both substrates are (100) surfaces.

2. The standard member for calibration according to claim 1,
   wherein the bonding of the bonded substrate is made by changing states such that, in a state before the bonding, atoms are arranged in the surface layers of the two opposing substrates, such that discontinuous boundaries between the atom arrangement in the outermost surface layer of each substrate and air existing, sandwiching the air, and in another state after the bonding, the discontinuous boundaries disappear, and the atom arrangements in the outermost surface layers of the two opposing substrates turn into a continuous atom arrangement.

3. The standard member for calibration according to claim 1,
   wherein the cross-section surfaces are cross-section surfaces made by cleaving or dicing.

4. The standard member for calibration according to claim 1,
   wherein a pair of the substrates is either a combination of single crystal substrates including silicon or a combination of non-crystal substrates including silicon.

5. The standard member for calibration according to claim 1,
   wherein the surface of the each substrate is either a silicon layer or a silicon oxide film layer.

6. The standard member for calibration according to claim 1,
   wherein the first sample cube comprises a silicon substrate having a multi-layer film structure in which silicon and silicon oxide film are deposited in layers periodically at a constant pitch between layers over the surface of the substrate;
   wherein the second sample cube comprises a silicon substrate having a multi-layer film structure of silicon and silicon oxide film layers not including the same pitch linewidth as in the first sample cube; and
   wherein the calibration pattern area includes the predetermined pitch linewidth of concavity and convexity patterns formed by selectively etching one of the materials of the layers deposited in each multi-layer film structure.

7. The standard member for calibration according to claim 1,
   wherein the two sample cubes are bonded together by fusion joining or bonding at normal temperature or direct bonding by heat.

8. The standard member for calibration according to claim 1,
   wherein the substrate surface of at least one of the two sample cubes is oxide film and the two sample cubes are bonded together by anodic bonding.

9. The standard member for calibration according to claim 1,
   wherein calibration position identification mark patterns are arranged in an electron optics adjustment pattern region.

10. The standard member for calibration according to claim 1,
    wherein the calibration pattern area comprises a magnification calibration pattern region and an electron optics adjustment pattern region; and
    wherein a pitch between the layers in the magnification calibration pattern region is fixed, falling in a range from 2 nm to 90 nm and a pitch between the layers in the electron optics adjustment pattern region is continuously variable in a range from 1 nm to 100 nm.

11. The standard member for calibration according to claim 1,
wherein the calibration pattern area comprises:
a pattern region for magnification calibration comprising a concavity and convexity pattern on a multi-layer film cross-section surface, formed by depositing different materials in layers periodically at a constant fixed pitch between layers; and
a pattern region for electron optics adjustment comprising a concavity and convexity pattern on a multi-layer film cross-section surface, formed by depositing different materials in layers at variable pitches between layers, wherein the pitch linewidth changes toward one direction,
wherein the pattern region for magnification calibration and the pattern region for electron optics adjustment are arranged such that the two concavity and convexity patterns are disposed adjacently on one axis and on substantially the same level, and
wherein the variable pitches between layers in the pattern region for electron optics adjustment include at least one pitch linewidth for rough adjustment, which is larger than the fixed pitch between layers in the pattern region for magnification calibration, and at least one pitch linewidth for finer adjustment, which is smaller than the fixed pitch between layers in the pattern region for magnification calibration.

12. The standard member for calibration according to claim 1,
wherein the calibration pattern area is defined within a plane of a wafer having the same size as a specimen to be measured.

13. A method for fabricating a standard member for calibration a scanning electronic microscope, wherein, from information for intensity of secondary or reflected electrons generated by scanning an observation region of a specimen to be measured by an incident electron beam, the scanning electronic microscope performs measurement of a pattern within the observation region, and
wherein the standard member for calibration comprising a calibration pattern area on a cross-section surface of a bonded substrate and the calibration pattern area comprising a pair of concavity and convexity patterns,
the method comprising steps of:
forming a first substrate having a multi-layer film structure over a substrate whose surface comprises a (110) surface or a (100) surface by depositing different materials in layers periodically at a constant pitch between layers over the substrate surface;
forming a second substrate having a multi-layer film structure not including layers formed at the same pitch linewidth as in the multi-layer film structure of the first substrate over a substrate whose surface comprises a (110) surface or a (100) surface;
bonding the first and second substrates together such that the surfaces of both multi-layer film structures join together, thus forming a bonded substrate;
making a sample cube with cross-section sides of the bonded substrate being exposed; and
selectively etching one of the materials of the layers deposited periodically in the multi-layer film structure in one of the cross-section sides and making a bonded cross-section sample having a constant pitch concavity and convexity pattern, wherein, in the step of making the sample cube, the cross-section surfaces are (111) surfaces when the surface of the each substrate is a (110) surface and the cross-section surfaces are (110) surfaces when the surface of the each substrate is a (100) surface.

14. The method for fabricating a standard member for calibration according to claim 13,
wherein the bonding step,
before the bonding, atoms are arranged in the surface layers of the two opposing substrates, such that discontinuous boundaries between the atom arrangement in the outermost surface layer of each substrate and air existing, sandwiching the air, and
after the bonding, the discontinuous boundaries disappear, and the atom arrangements in the outermost surface layers of the two opposing substrates turn into a continuous atom arrangement.

15. The method for fabricating a standard member for calibration according to claim 13,
wherein the step of making cross-section surfaces of the bonded substrate makes the cross-section surfaces by cleaving or dicing.

16. The method for fabricating a standard member for calibration according to claim 13,
wherein the first and second substrates are silicon substrates, the surfaces of the two substrates are either silicon or silicon oxide film silicon, and
wherein the step of bonding the two substrates together performs fusion joining or bonding at normal temperature.

17. The method for fabricating a standard member for calibration according to claim 13,
wherein the first and second substrates are silicon substrates, the surface of at least on of the two substrates is oxide film silicon, and
wherein the step of bonding the two substrates together performs anodic bonding.

18. A scanning electronic microscope that, from information for intensity of secondary or reflected electrons generated by scanning an observation region of a specimen to be measured by an incident electron beam, performs measurement of a pattern within the observation region, the scanning electronic microscope comprising:
a specimen stage that supports the specimen or a standard member for calibration;
an irradiation optical system that scans the specimen on the specimen stage by an electron beam;
a detector that detects secondary or reflected electrons generated by scanning by the electron beam;
a signal processing means that makes a length measurement of the specimen by processing electronic signals obtained from the detector;
a display means on which length measurement results are displayed;
a bias power supply that applies a voltage to the specimen stage to control a voltage accelerating the electron beam; and a calibration function that performs magnification calibration of the irradiation optical system from information for intensity of the secondary or reflected electrons with respect to the standard member for calibration mounted on the specimen stage,
wherein the standard member for calibration comprises:
a bonded substrate into which a first sample cube and a second sample cube, each comprising a multi-layer film structure in which different materials are alternately deposited in layers over the surface of a substrate and its cross-section surfaces, are bonded together, their plane directions being aligned in the same orientation at the surfaces of both the multi-layer film structures; and a calibration pattern area defined on one of the cross-section surfaces of the bonded substrate, wherein a pair of concavity and convexity patterns are formed in the calibration pattern area by fabricating the each multi-layer film structure, the cross-section surfaces are (111) surfaces when the surfaces of the both substrates are (110) surfaces, and the cross-section surfaces are (110) surfaces when the surfaces of the both substrates are (100) surfaces.

19. The scanning electronic microscope according to claim 18, wherein a pitch linewidth of a first pattern which is one of the concavity and convexity patterns is obtained beforehand by light or x-ray diffraction, and wherein the scanning electronic microscope comprises a function of comparing a pitch linewidth of the either film structure obtained by the signal processing means with the pitch linewidth obtained beforehand by the light or x-ray diffraction and performing magnification calibration of the irradiation optical system so that the difference between both becomes virtually zero.

20. The scanning electronic microscope according to claim 18, wherein the calibration pattern area is defined within a plane of a wafer having the same size as a specimen to be measured; and wherein the standard member for calibration is a wafer-form standard member having the same size as the specimen to be measured and configured to be mountable on the specimen stage.

* * * * *